US006926541B2

(12) United States Patent
Takeuchi et al.

(10) Patent No.: US 6,926,541 B2
(45) Date of Patent: Aug. 9, 2005

(54) MOUNTING STRUCTURE OF ELECTRIC JUNCTION BOX

(75) Inventors: Kunihiko Takeuchi, Shizuoka (JP); Masahiro Sugiya, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/649,801

(22) Filed: Aug. 28, 2003

(65) Prior Publication Data

US 2004/0043646 A1 Mar. 4, 2004

(30) Foreign Application Priority Data

Aug. 30, 2002 (JP) ....................................... 2002-252911
May 30, 2003 (JP) ....................................... 2003-154692

(51) Int. Cl.[7] .................................................. H05K 5/03
(52) U.S. Cl. ...................................................... 439/76.2
(58) Field of Search ................................ 439/76.2, 949

(56) References Cited

U.S. PATENT DOCUMENTS 5,913,689 A * 6/1999 Kato ......................... 439/76.2
6,780,026 B2 * 8/2004 Sato .......................... 439/76.2
2003/0022536 A1 * 1/2003 Saito et al. ................ 439/76.2

FOREIGN PATENT DOCUMENTS

JP 7-9023 2/1995

* cited by examiner

*Primary Examiner*—Renee Luebke
(74) *Attorney, Agent, or Firm*—Armstrong, Kratz, Quintos, Hanson & Brooks, LLP

(57) ABSTRACT

The mounting structure of the junction box 1, in which an external wiring harness is connected to an internal electronic unit 5 through a busbar 30, includes: a terminal part 33 of the busbar 30; a housing member 50 for receiving the terminal part 33; a projecting piece 55 projecting from the housing member 50; and a cavity part 56 of the projecting piece 55, into which an electric contact part 36 of the busbar 30 is inserted; wherein the terminal part 33 is combined with the housing member 50 so as to form a connector part 3 to be connected to a mating connector of the external wiring harness and the electric contact part 36 is inserted into the cavity part 56 so as to correct the inclined electric contact part 36, thereby connecting the corrected electric contact part 36 to the electronic unit 5.

5 Claims, 18 Drawing Sheets

MOUNTING STRUCTURE OF ELECTRIC JUNCTION BOX

BACKGROUND OF THE INVENTION (1) Field of the Invention

The present invention relates to a mounting structure of an electric junction box, into which an electronic unit, for example, an electronic control unit of a motor vehicle is mounted and to a jig for connecting terminals to a mating connector upon assembling an electric junction box.

(2) Description of the Related Art

FIG. 26 shows an example of a conventional electric junction box (referring to Japanese Utility Model Application Laid-Open No. H7-9023).

This junction box 501 includes an upper cover 502 made of synthetic resin, lower cover 503, i.e. body of the junction box, wire-arranging board 504 stacked and received between both covers 502 and 503, and busbar-arranging board 505.

The wire-arranging board 504 includes an insulating board 506 made of synthetic resin, a plurality of insulation-coated wires 507 arranged on a surface of the insulating board 506, and terminal 508 which passes through the insulating board 506 and is pressure-welded to a wire 507. The terminal 508 is provided with a pressure-welding part 508*a* at one side thereof and a male tab-shaped electric contact part 508*b* at an opposite side thereof.

The busbar 505 includes an insulating board 509 and a plurality of busbars 510 arranged on a surface of the insulating board 509. The busbar 510 includes a male tab-shaped terminal 511 integrally rising up therefrom or a male tab-shaped terminal 511 integrally rising down therefrom.

The terminals 508, 511 protrude in the respective housings 512, 513 of the respective upper and lower covers 502, 503. The terminals 508, 511 are combined with the respective housings 512, 513 so as to construct a connector, to which a mating connector (not shown in the figure) of an external wiring harness is connected.

However, in the junction box 501 described above, each terminal 508, 511 may not possibly be attached accurately quickly to the corresponding insulating board 506, 509. Each terminal 508, 511 may possibly be attached to the corresponding insulating board 506, 509 on a condition that each terminal 508, 511 is inclined and shifted from a proper position thereof.

In order to attach each terminal 508, 511 accurately to the corresponding insulating board 506, 509, it has been proposed that a fixing component (not shown in the figure) for improving an attaching accuracy of each terminal 508, 511 is newly provided separately to the corresponding insulating board 506, 509. However, this method results in an increase in the number of the components, causing an increase in the size of the junction box, complication in an assembling step of the junction box, and an increase in a cost of the junction box.

SUMMARY OF THE INVENTION

It is therefore an objective of the present invention to solve the above problem and to provide a mounting structure of an electric junction box, by which the junction box is made compact, the number of the components is prevented from increasing, and workability for assembling the junction box is improved.

It is also an objective of the present invention to solve the above problem and to provide a jig for smoothly connecting terminals to a mating connector without interference upon assembling an electric junction box.

In order to attain the above objective, the present invention is to provide a mounting structure of an electric junction box, in which an external wiring harness is connected to an internal electronic unit through a busbar, comprising:

a terminal part of the busbar;

a housing member for receiving the terminal part;

a projecting piece projecting from the housing member; and a cavity part of the projecting piece, into which an electric contact part of the busbar is inserted;

wherein the terminal part is combined with the housing member so as to form a connector part, which is connected to a mating connector of the external wiring harness, and the electric contact part is inserted into the cavity part so as to correct the inclined electric contact part, thereby connecting the corrected electric contact part to the electronic unit.

With the construction described above, there is no need to newly provide a component for correcting the electric contact part of the busbar, which electric contact part is inclined and shifted from its proper position, to the electric junction box. The housing member functions as such a component for correcting the electric contact part. Therefore, the number of the components provided in the junction box is prevented from increasing, thereby providing a compact junction box.

Preferably, a plurality of the electric contact parts are substantially aligned with each other, and when each electric contact part is inclined in a thickness direction thereof, tapered faces for facilitating insertion of a plurality of the electric contact parts into a plurality of the cavity parts are formed at insertion parts of a plurality of the cavity parts.

With the construction described above, when a plurality of the inclined electric contact parts of the busbar are being inserted into a plurality of the cavity parts, each electric contact part is guided by a tapered face and inserted into the corresponding cavity part. Thereby, each electric contact part, which is inclined and shifted from its proper position, is smoothly inserted into the corresponding cavity. Therefore, an electric junction box having good workability for mounting can be provided.

Preferably, a plurality of the electric contact parts are substantially aligned with each other, and when each electric contact part is inclined in a thickness direction thereof, inclined faces for facilitating insertion of a plurality of the electric contact parts into a plurality of the cavity parts are formed at ends of a plurality of the electric contact parts.

With the construction described above, when a plurality of the inclined electric contact parts of the busbar are being inserted into a plurality of the cavity parts, each electric contact part is guided by an inclined face and inserted into the corresponding cavity part. Thereby, each electric contact part, which is inclined and shifted from its proper position, is smoothly inserted into the corresponding cavity. Therefore, an electric junction box having good workability for mounting can be provided.

Preferably, the connector part and the electronic unit are adjacently arranged on an upper part of an electric junction box body in which the connector part and the electronic unit are provided.

With the construction described above, the electronic unit is easily mounted into the electric junction box body. Therefore, an electric junction box having good workability for mounting the electronic unit can be provided. Further, the connector of the junction box can be easily coupled with a mating connector of an external wiring harness.

Preferably, the busbar is mounted on a wiring board on which the housing member and the electronic unit are mounted.

With the construction described above, the busbar is simply mounted on the wiring board, thereby eliminating unnecessary components for mounting the busbar. Further, the housing member and the electronic unit can be securely mounted on the wiring board.

In order to attain the above objective, the present invention is to provide a jig for correcting terminal alignment comprising a pair of sticks which positionally corrects a plurality of aligned terminals in a direction crossing the alignment direction of the terminals at right angles.

With the construction described above, a slit for inserting the terminals is obtained between the pair of the sticks. By inserting the respective terminals into the slit, a slant of each terminal in the direction, which crosses the alignment direction of the terminals at right angles, is corrected. Alternatively, the pair of the sticks can hold each terminal in the above-mentioned direction, thereby nipping each terminal so as to correct the slant of each terminal in the above-mentioned direction.

Further, with the construction described above, for example, the insertion of each terminal into a connector housing, a mating terminal in a connector, and a terminal insertion through hole in a circuit board can smoothly accurately be carried out without interference, thereby improving the quality of terminal insertion and reliability of electric connection.

Preferably, the pair of the sticks is openable in a direction of nipping the terminals.

With the construction described above, a gap formed between the pair of the sticks can be adjusted to a desired specific dimension (for example, to a dimension for preventing each terminal from slanting). Further, the gap can be adjusted freely, thereby easily meeting the demand for various shape and size of the terminal.

Preferably, the pair of the sticks is provided with a tapered guide face for the terminal.

With the construction described above, when each terminal is inserted into the slit between the pair of the sticks, the tapered guide face smoothly guides each terminal into the slit. Alternatively, when the opened pair of the sticks is being entered, the sticks smoothly enters without interference with each terminal.

Preferably, the pair of the sticks is operated by opening/closing motion drive means and linear motion drive means in a direction of the terminal alignment and/or in a longitudinal direction of the terminal.

With the construction described above, the pair of the sticks is opened or closed in the direction crossing the alignment direction of the terminals at right angles by the opening/closing motion drive means and is moved in a direction of the terminal alignment by a first linear motion drive means and/or in a longitudinal direction of the terminal by a second linear motion drive means. The pair of the sticks can first be moved by the second linear motion drive means and thereafter, be moved by the first linear motion drive means. In the best mode for carrying out the preferred embodiment, first the pair of the sticks is opened by the first linear motion drive means, thereafter the pair of the sticks is moved forward by the first or second linear motion drive means so as to be situated at both sides of each terminal, thereafter the pair of the sticks is closed by the opening/closing motion drive means so as to correct the terminal alignment, thereafter the pair of the sticks is opened again by the opening/closing motion drive means and finally, the pair of the sticks is moved backward by the first or second linear motion drive means.

In order to attain the above objective, the present invention is to provide an electric junction box capable of correcting terminal alignment comprising a part for guiding the pair of sticks of the jig as described above therethrough, said part being provided on a wall of a body of the electric junction box in an alignment direction of terminals in the body of the electric junction box.

With the construction described above, the pair of the sticks is inserted into the inside of the junction box from the above-mentioned part for guiding the pair of sticks of the jig such as a notched hole or through hole formed in a wall part of the body of the junction box, so that the pair of the sticks can be correct the slant of each terminal aligned in the body of the junction box. The insertion of the pair of the sticks may be done in the longitudinal direction of the stick or in a direction crossing the longitudinal direction from an end of the stick. Each terminal in the body of the junction box is inserted into a hole of a circuit board or connected to a terminal of a mating connector smoothly securely.

Preferably, the terminal has a tab-shape and/or a pin-shape and at least the tab-shaped terminals are aligned in a width direction of a circuit board of the electric junction box.

With the construction described above, each tab-shaped terminal is nipped by the pair of the sticks in the thickness direction of the electric junction box, or alternatively, only a slanted terminal is raised by the stick at the pertinent side and corrected. Thus, the correction of the slant of a plurality of the tab-shaped (plate-shaped) terminals in the thickness direction of the circuit board of the electric junction box can be simultaneously carried out by the pair of the sticks. The shape of the pair of the sticks has a part for coming in contact with both sides of the tab-shaped terminal, that is, the shape of the pair of the sticks may be a simple shape such as a straight pin-shape.

In order to attain the above objective, the present invention is to provide a method of correcting terminal alignment using the jig as described above comprising the steps of:

opening the pair of the sticks up to the maximum allowable dimension of the terminal alignment correction; and inserting the aligned terminals between the pair of the sticks.

With the construction described above, the slant of the terminal is corrected within the maximum allowable dimension of the terminal alignment correction. Here, the maximum allowable dimension is a value expressing the limitation of allowable slant of the terminal, that is, the terminal can be inserted into a mating hole or terminal without interference provided that the slant is within the limitation of allowable slant. The pair of the sticks does not nip all of the terminals but nips only the slanted terminals so as to correct the slant of the terminals in the nipping direction.

In order to attain the above objective, the present invention is to provide a method of correcting terminal alignment using the jig as described above comprising the steps of:

opening the pair of the sticks;

inserting the aligned terminals between the pair of the sticks; and closing the pair of the sticks, thereby correcting alignment of the terminals for a nipping direction of the pair of the sticks.

With the construction described above, the pair of the sticks is situated at both sides in the direction crossing the terminal alignment direction at right angles without contacting and is moved in its closing direction so as to correct the slanted terminals straightly. The closing amount of the pair of the sticks may correspond to that for contacting all of the terminals, or alternatively, to that for contacting only the slanted terminals so as to correct the slant of the terminals within the above-mentioned maximum allowable dimension. When the slant of the terminals is thus corrected, a mating unit is mounted or connected thereto, thereafter the pair of the sticks may be opened so as to be parted away from each terminal.

In order to attain the above objective, the present invention is to provide a method of inserting terminals using the method as described above comprising the steps of:

correcting alignment of the terminals with the pair of the sticks;

inserting the terminals halfway into a mating unit;

opening the pair of the sticks so as to set the pair of the sticks apart from the terminals; and inserting the terminals completely into the mating unit.

With the construction described above, the pair of the sticks corrects the slant of the terminals, then a mating unit is being mounted thereinto, so that each terminal can be provisionally inserted into the mating unit smoothly securely without interference. The mating unit means, for example, a connector having mating terminals, circuit board having a hole for receiving the terminal, and circuit board having a connector. Since the pair of the sticks is opened upon parting away from the terminals, the sticks never interfere with each terminal. When the pair of the sticks is parted away from each terminal, since each terminal is already provisionally inserted into the mating unit, each terminal can be completely inserted in the mating unit by only pushing the mating unit toward the longitudinal direction of the terminals.

Preferably, when the mating unit is mounted to the electric junction box as described above, the pair of the sticks corrects alignment of the terminals.

With the construction described above, the pair of the sticks is inserted from the guide part for inserting the jig of the body of the junction box so that the slant of the terminals aligned in the body are corrected by the pair of the sticks, then a mating unit is provisionally mounted smoothly into the body of the junction box without interference with the terminals. Since each terminal is provisionally inserted into the mating unit, each terminal can be completely inserted in the mating unit by only pushing the mating unit toward the longitudinal direction of the terminals, thereby improving the property of assembling of the electric junction box and mounting of an external unit to the electric junction box.

DESCRIPTION OF THE PREFERRED EMBODIMENTS

In the following, the preferred embodiments of the present invention will be explained with reference to the attached drawings.

FIGS. 1–11 illustrate a preferred embodiment of the mounting structure of an electric junction box according to the present invention.

Figure 1:
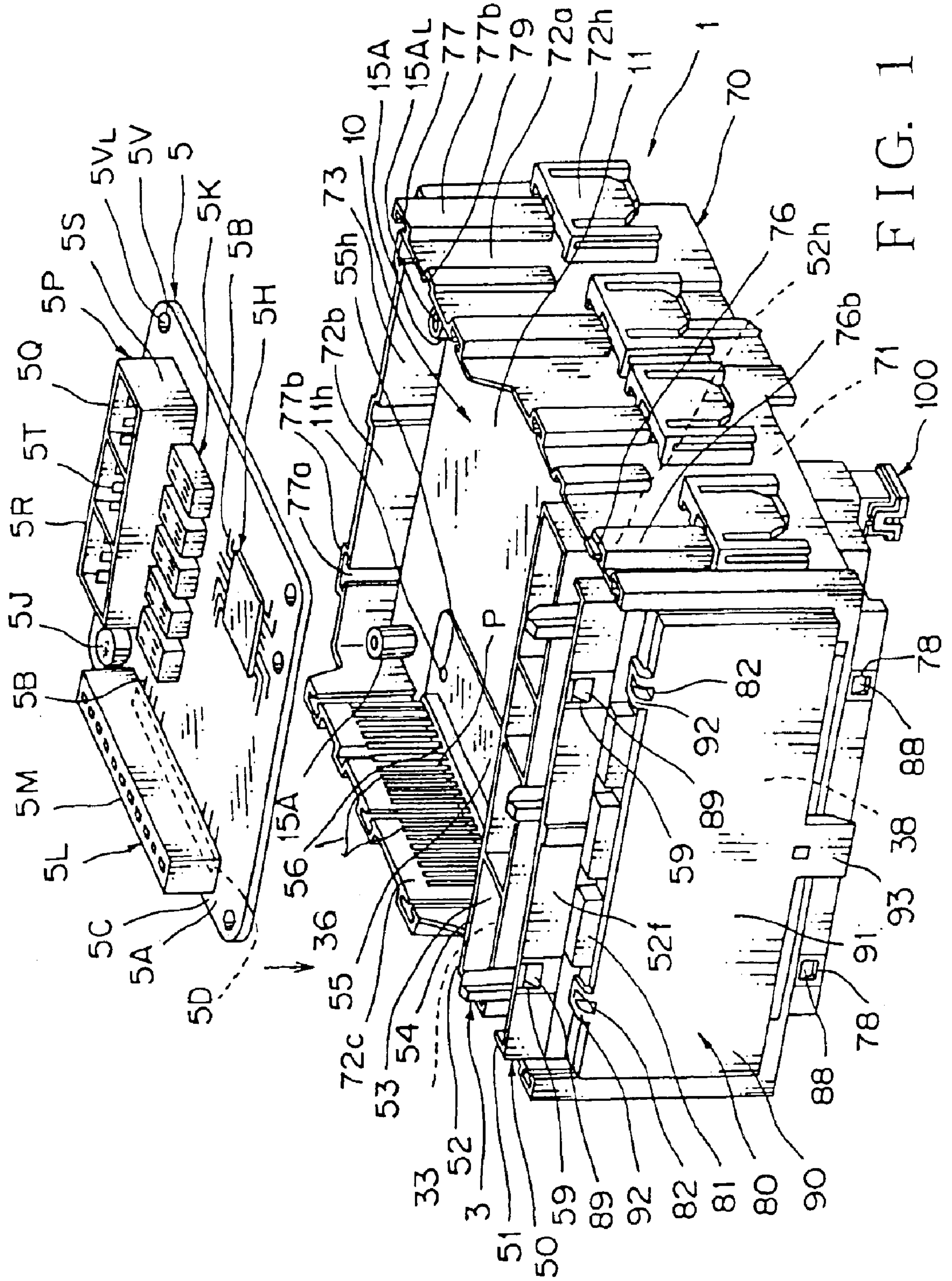
FIG. 1 is an exploded perspective view illustrating a preferred embodiment of a mounting structure of an electric junction box according to the present invention.

Each direction regarding an electric junction box 1 shown in FIG. 1 is as follows: a side where an electronic unit 5 is located within a body 70 of the junction box 1 is defined as the upper side; a side where a holding member 100 made of synthetic resin is mounted in the body 70 is defined as the lower side; a side where a cover 90 is mounted on a fuse block 80 is defined as the front side; a side where a side wall 72*b* for forming the body 70 is located is defined as the rear side; and a direction from one side wall 72*a* for forming the body 70 toward an opposite side wall 72*c* or a direction from the opposite side wall 72*c* toward the one side wall 72*a* is defined as the right and left direction.

The above-defined "upper and lower", "front and rear", and "right and left" are only for the explanation described in the following and therefore, they do not necessarily agree with the respective directions in the real use of the junction box.

As shown in FIG. 1, in the mounting structure of the junction box 1, an external wiring harness (not shown in the figure) placed outside the upper side of the body 70 of the junction box 1 is electrically connected to the electronic unit 5 placed at the upper side within the body 70 through a plurality of busbars 30.

In the electronic unit 5, electric and electronic components such as an IC package 5H, capacitor 5J, relay junction mount 5K for mounting a relay (not shown in the figure), a connector 5L and another connector 5P are attached on an insulating board 5A made of synthetic resin, i.e. printed board 5A, on which a circuit conductor 5B is printed, and these components are electrically connected to each other by respective circuit conductors made of copper foil, thereby constructing an electronic control unit.

The above-mentioned "IC" means an integrated circuit, that is, one of the electronic circuit, in which many circuit elements such as a transistor, diode, resistor and capacitor are combined on or in a board, thereby constructing an electronic circuit having a highly dense structure, in which these circuit elements are connected to each other by wiring.

The electronic control unit is called as ECU, which includes control means (control by a computer) and judging means. The circuit conductor 5B printed on the insulating board 5A made of synthetic resin is protected by a transparent or translucent insulating coating 5C.

A terminal (not shown) made of metal is inserted in a connector housing 5M made of synthetic resin so as to form a connector 5L. Corresponding to the connector 5L, the board 5A is provided with a rectangular opening 5D at the lower side of the connector 5L, thereby an electric contact part 36 of the busbar 30 is made connectable from the lower side of the connector 5L.

A mounting part (not shown) of each terminal provided in the connector 5L is soldered to the corresponding circuit conductor 5B printed on the insulating board 5A, thereby each terminal is electrically connected to the corresponding circuit board 5B. Thus, the connector 5L shown in FIG. 1 is used as a connector 5L for PCB having a perpendicular mounting type. The "PCB" means a printed circuit board.

The another connector 5P includes a male terminal 5T made of metal and a connector housing 5Q made of synthetic resin. Each male terminal 5T is electrically connected to the corresponding circuit conductor 5B printed on the insulating board 5A.

Figure 2:
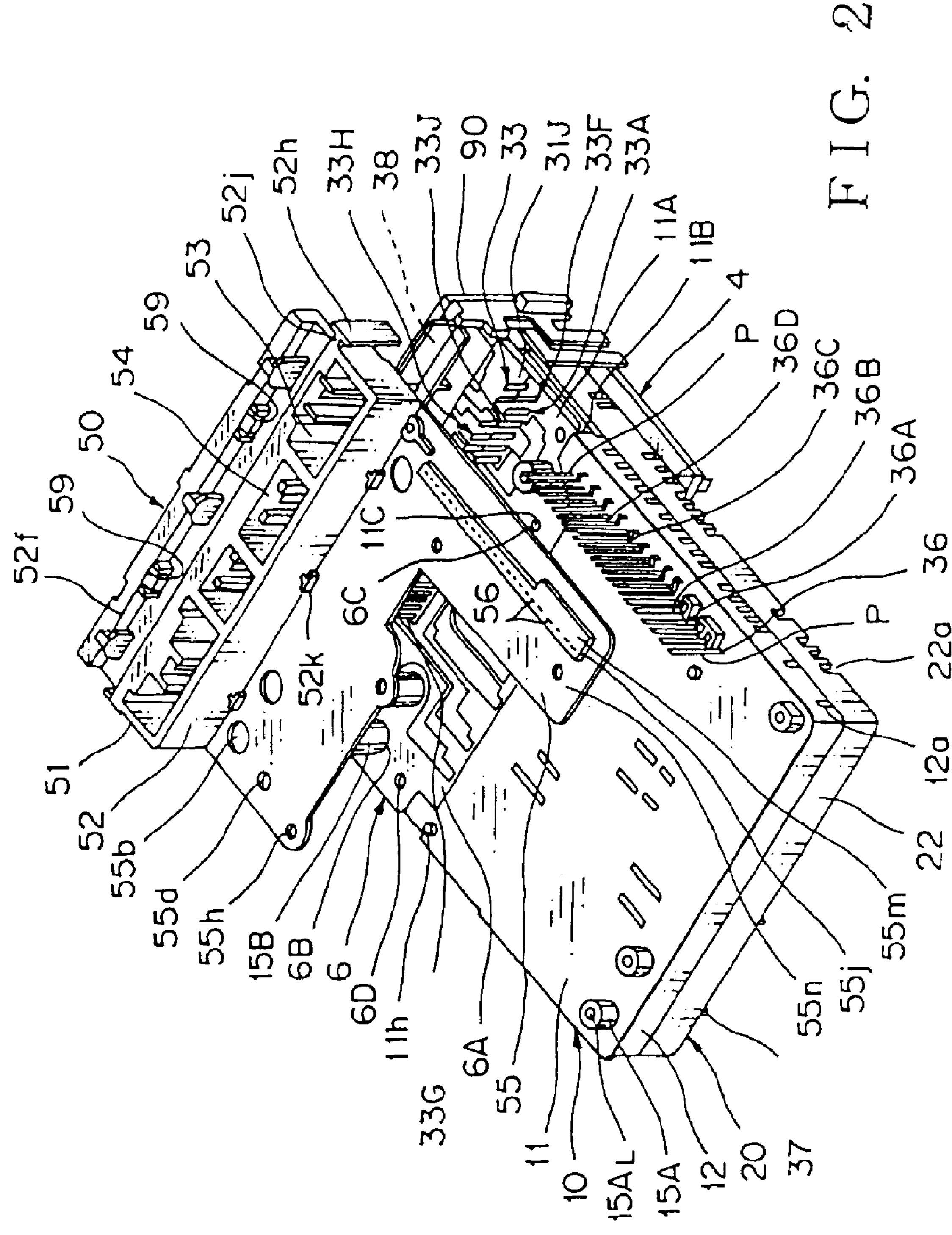
FIG. 2 is an exploded perspective view illustrating a state when a housing member is being mounted on an wiring board.

As shown in FIGS. 1–4, the busbar 30 made of metal is provided with a tab-shaped terminal part 33 at an end thereof. Further, the busbar 30 made of metal is provided with a tab-shaped electric contact part 36 at an opposite end thereof. As shown in FIG. 2, the terminal part 33 provided on an electric power source module 6 and the electric contact part 36 provided on a wiring board 10 made of synthetic resin are placed facing upward in the body 70, into which the terminal part 33 and electric contact part 36 are mounted. Here, the module means a part of a device, machine or system and means an unit which functions as a group.

Figure 3:
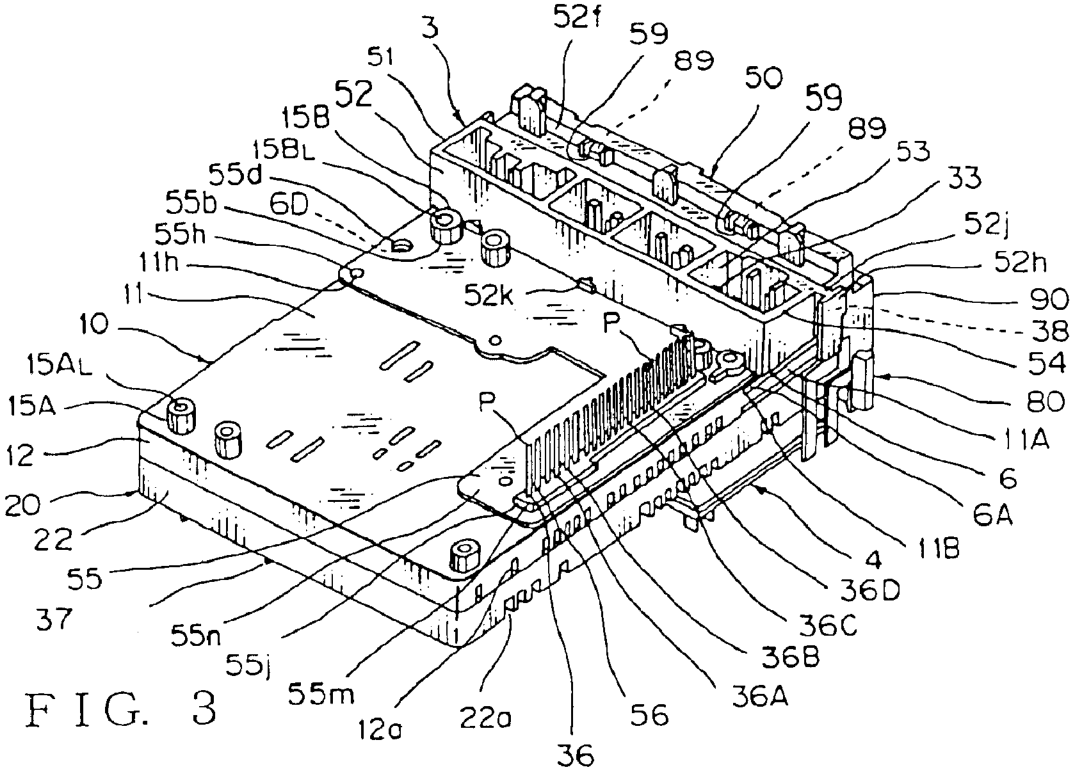
FIG. 3 is a perspective view illustrating a state after a housing member is mounted on an wiring board.

As shown in FIGS. 2 and 3, a projecting piece 55 extends from one end of a circumferential wall 52 made of synthetic resin provided on a housing member 50, thereby a housing body 51 made of synthetic resin and the projecting piece 55 are formed integrally with each other. The projecting piece 55 is formed an inverse L-shaped thin plate member.

As shown in FIGS. 2–5, a thin part 55*n* of the projecting piece 55 is provided with a step part 55*j* and the projecting piece 55 of the housing member 50 is provided with a thick part 55*m*. The thin part 55*n* and thick part 55*m* of the projecting piece 55 are integrally formed with each other by using the same material of synthetic resin. Further, the thick part 55*m* is provided with a plurality of cavity parts 56 into which the electric contact parts 36 of a plurality of the busbars are inserted. Here, the cavity part means a gap, hollow or hole. The thick part 55*m* may be formed separately from the projecting piece 55 so as to attached to the thin part 55*n* of the projecting piece 55.

As shown in FIGS. 2 and 3, the terminal part 33 of the busbar 30 is combined with the housing body 51 of the housing member 50, thereby the connector part 3, which is electrically connected to a mating connector (not shown) of an external wiring harness (not shown), is constructed as shown in FIGS. 1 and 3.

Figure 4:
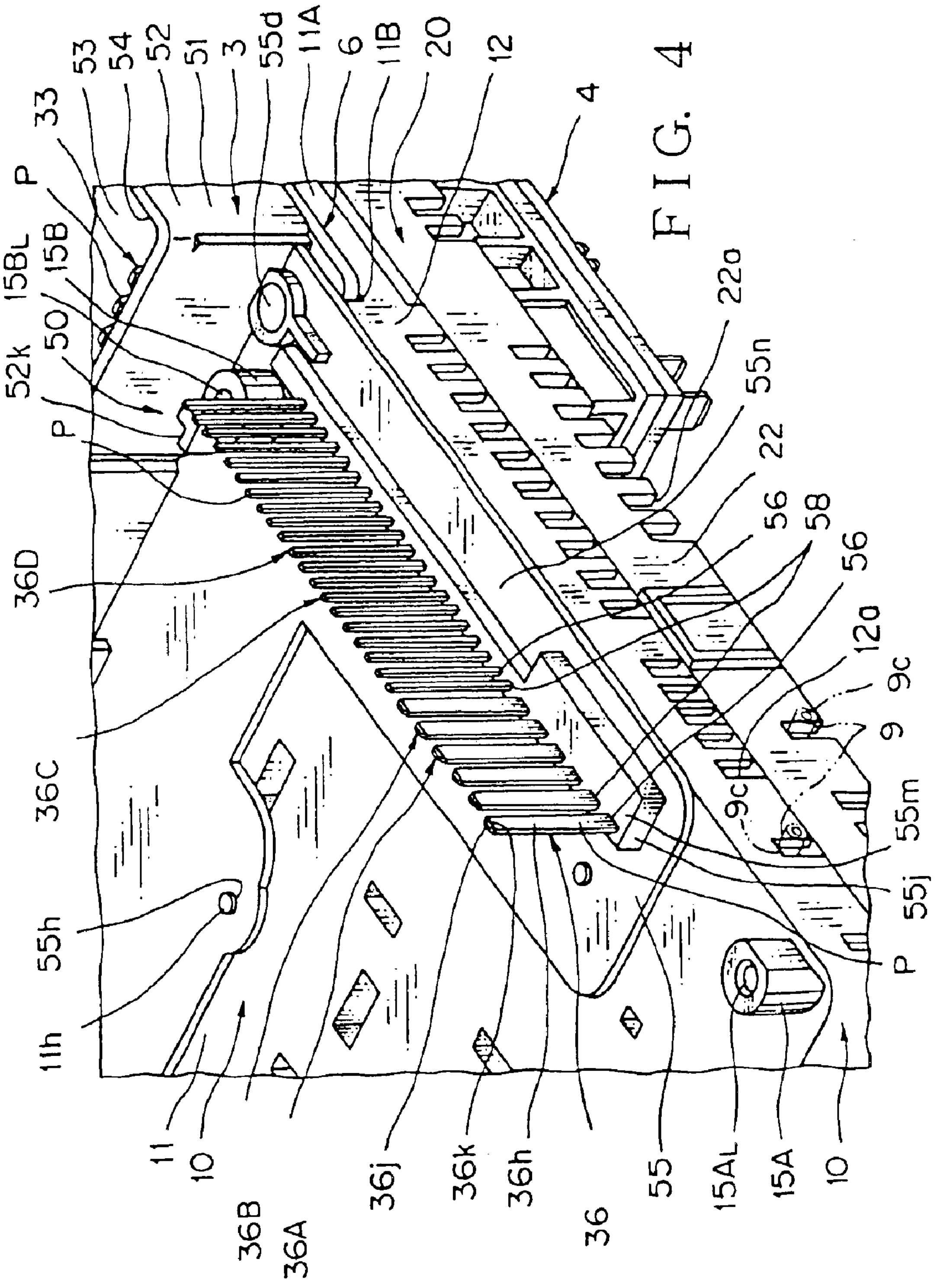
FIG. 4 is an enlarged perspective view illustrating an electric contact part shown in FIG. 3.

The housing member 50 made of synthetic resin is mounted on the body 70, power source module 6 and the wiring board 10, thereby each terminal part 33 is protrudingly placed in a receiving part 53 of the housing body 51. As shown in FIGS. 3 and 4, each terminal part 33 is located in an opening 54 of the receiving part 53.

As the connector part 3 is constructed, a plurality of the electric contact parts 36 formed protrudingly upward from the wiring board 10 are inserted in a plurality of cavity parts 56 formed in the projecting piece 55 of the housing member 50. At this time, as shown in FIGS. 2–4, a plurality of the electric contact parts 36 (see FIG. 5), which are inclined, and the respective positions of which are not determined, are inserted in the respective cavity parts 56 provided in the projecting piece 55. Thereby, a plurality of the electric contact parts 36 are substantially aligned so as to be corrected regarding their positions. Further, thus corrected each electric contact part 36 is electrically connected to the corresponding terminal (not shown) of the connector L (see FIG. 1) provided in the electronic unit 5.

By using the housing member 50 as described above, a member for aligning and correcting the electric contact parts 36, which are inclined, and the respective positions of which are not determined, is not necessary in the junction box 1.

As shown in FIGS. 2 and 3, the projecting piece 55 is formed protrudingly from one end of the housing body 51 so as to from the housing body 51 and the projecting piece 55 integrally with each other, and the projecting piece 55 is provided with a plurality of cavity parts 56 into which the respective electric contact parts 36 of the busbars are inserted. Therefore, the housing member 50 functions as a component for aligning and correcting a plurality of the electric contact parts 36. That is, the number of the components to be provided in the junction box 1 (see FIG. 1) can be prevented from increasing, thereby a compact junction box 1 can be provided.

As shown in FIGS. 2 and 3, since the housing body 50 is mounted on the wiring board which includes the power module 6, a busbar body 31J made of metal of the power module 6 shown in FIG. 2 is protected by the housing body 50 made of synthetic resin (see FIGS. 1 and 3). Thereby, the power module 6 mounted on the wiring board 10 and the electronic unit 5 (see FIG. 1) mounted on the upper side of the wiring board 10 are securely electrically insulated with each other.

Figure 11:
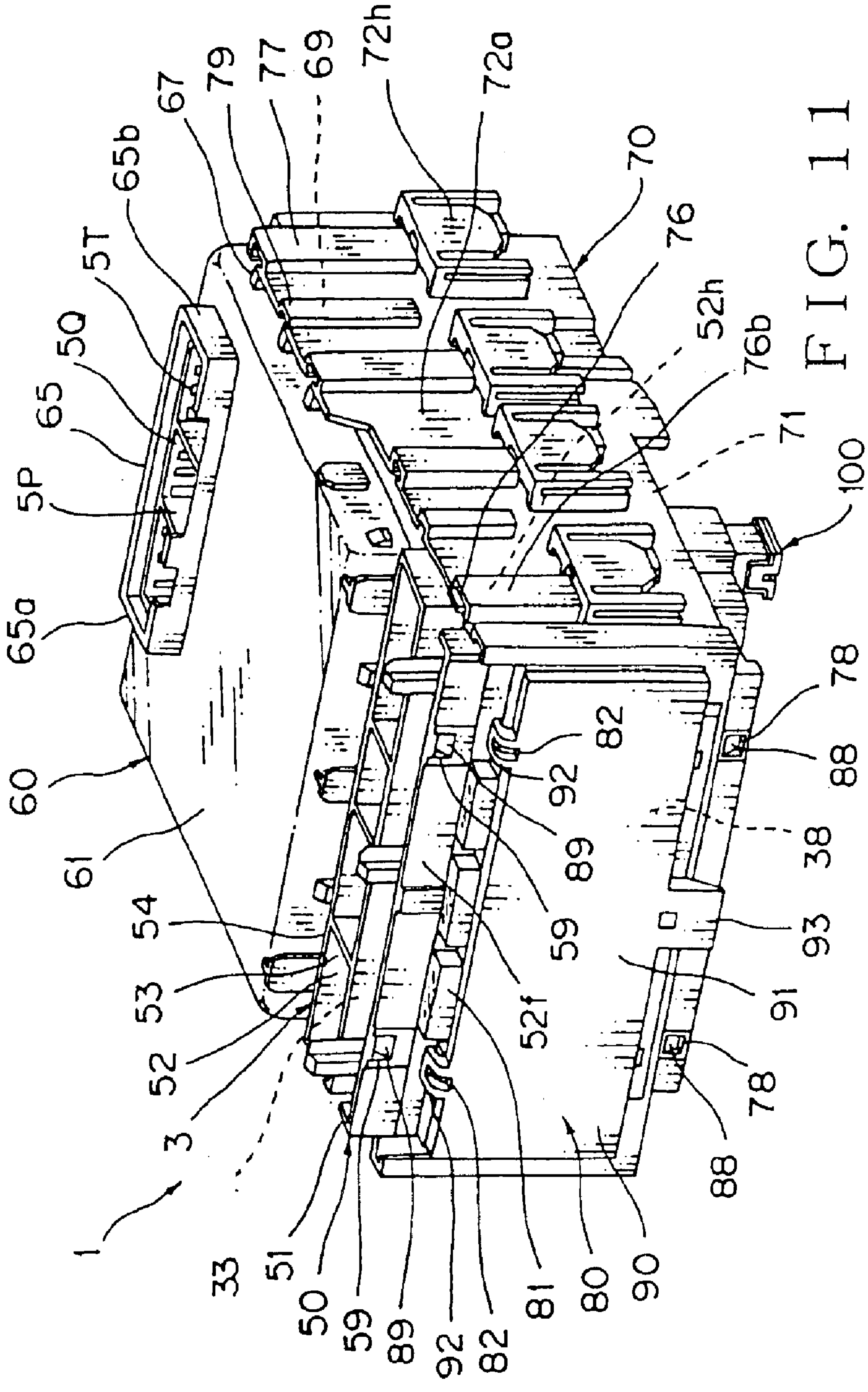
FIG. 11 is a perspective view illustrating an assembled state of an electric junction box.

As shown in FIG. 1, the electronic unit 5 and the wiring board 10 are received in the receiving part 73 of the body 70 of the junction box 1. A part of the housing member 50 such as the projecting piece 55 is located inside the body 70, and as shown in FIG. 11, the housing body 51 of the housing member 50 is exposed outside the body 70. The connector part 3 is provided outside the junction box 1 so as to be easily electrically connected to an external wiring harness (not shown).

As shown in FIG. 2, each busbar 30 is mounted on the upper layer of the wiring board 10, on which the housing member 50 and the electronic unit 5 (see FIG. 1) are mounted, thereby eliminating unnecessary components for mounting the busbar. Further, the housing member 50 and the electronic unit 5 can be securely mounted on the wiring board 10.

As shown in FIGS. 2–4, 6 and 7, busbars 30A, 30B, 30C and 30D made of metal having the respective electric contact parts 36A, 36B, 36C and 36D having various shapes are mounted on the wiring board 10 made of synthetic resin. As shown in FIG. 2, a part of the busbar 30B, 30D is bent into a crank shape so that the busbar 30B, 30D is provided with the electric contact part 36B, 36D. The electric contact part 36C, 36D of the busbar 30C, 30D is formed as the electric contact part which is thinner than the electric contact part 36A, 36B of the busbar 30A, 30B.

As shown in FIG. 2, busbars 30A, 30F, 30G, 30H, 30J made of metal having terminal part 33A, 33F, 33G, 33H, 33J having various shapes are formed penetratingly or mounted on a board 6A made of synthetic resin for constituting the power module 6. The terminal part 33G of the busbar 30G is formed as a terminal part which is thinner than the terminal part 33A, 33F, 33H, 33J of the busbar 30A, 30F, 30H, 30J.

For example, like the busbar 30J, the busbar body 31J is bent at right angles so as to form the terminal part 33J. The busbar having various shapes is formed in a specific shape by a process comprising the steps of: punching step for punching a metal plate by using press molding machine so as to form terminal fitting element having various shapes such as a long rod shape; and press-molding the terminal fitting element.

Figure 6:
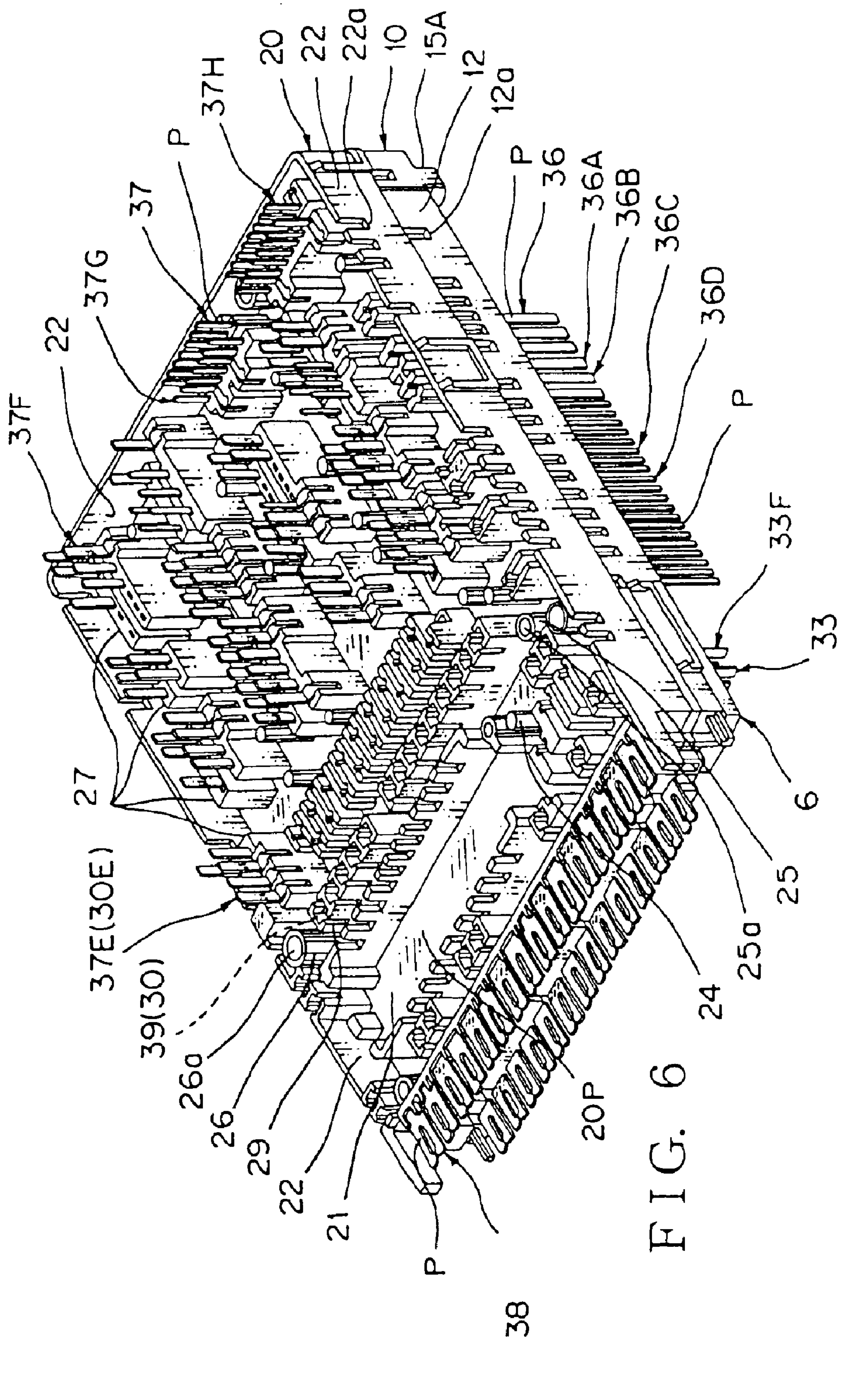
FIG. 6 is a perspective view illustrating a state when wiring boards are attached to each other.

As shown in FIG. 6, busbar 30E, 30F, 30G, 30H made of metal including an electric contact part 37E, 37F, 37G, 37H having various shapes is mounted on a wiring board 20 made of synthetic resin. A part of the busbar 30F, 30H is bent into a crank shape so that the busbar 30F, 30H is provided with the electric contact part 37F, 37H. The electric contact part 37G, 37H of the busbar 30G, 30H is formed as the electric contact part which is thinner than the electric contact part 37E, 37F of the busbar 30E, 30F.

Figure 7:
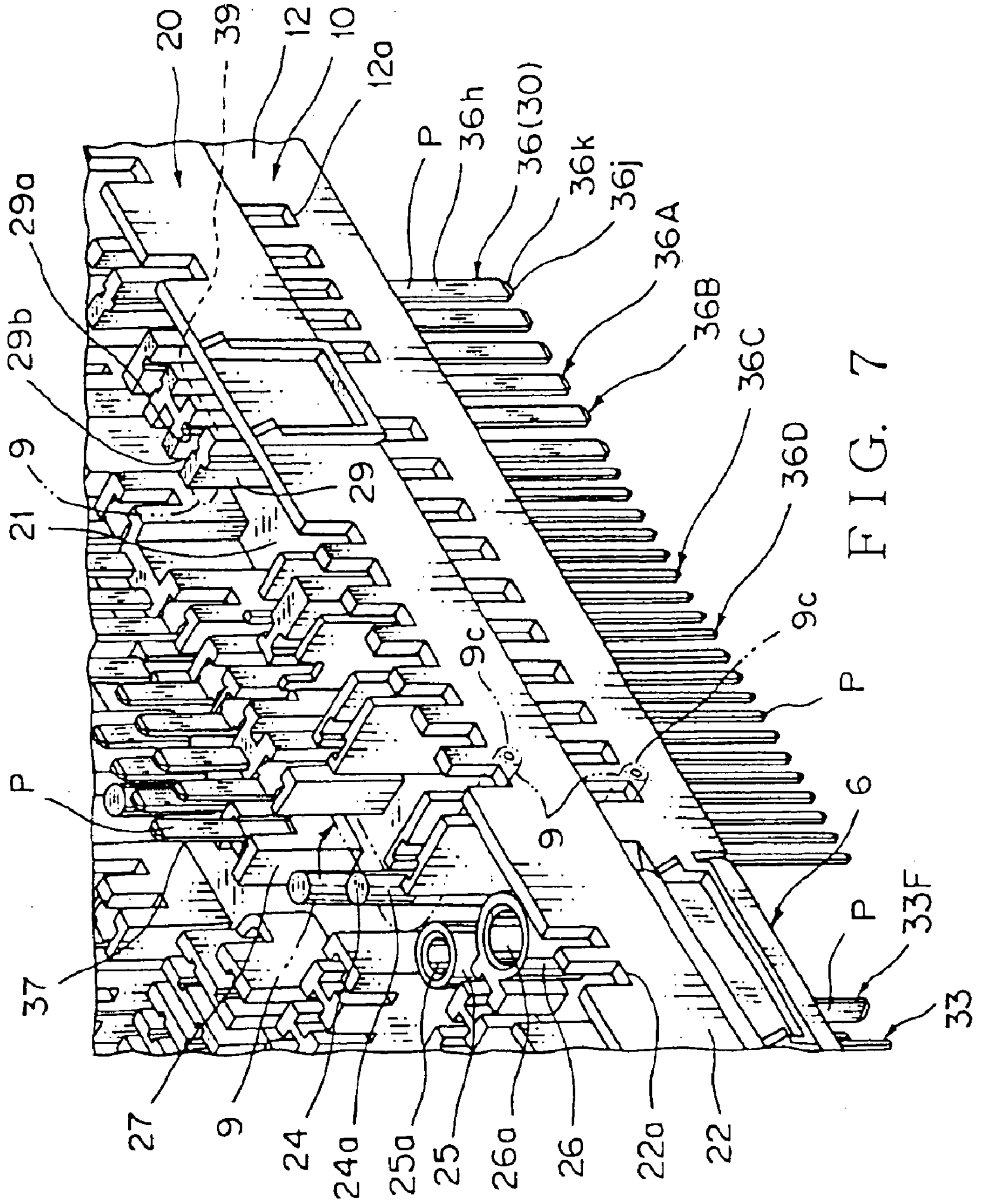
FIG. 7 is an enlarged perspective view illustrating an electric contact part shown in FIG. 6.

As shown in FIGS. 6 and 7, the back side of the wiring board 10, 20 is provided with many holding parts 29, into each of which a pressure-welding terminal part 39 of the busbar 30 is inserted, and many holding parts 27, into each of which a tab-shaped electric contact part 37 of the busbar 30 is inserted. In order to securely fix the wiring board 10, 20 to a base wall of the body of the junction box, a plurality of cylindrical fixing parts 25, 26 are provided on the back side of a board 21 which constitutes the wiring board 20. A plurality of the fixing parts 25, 26 are provided with the respective fixing holes 25*a*, 26*a* into which a stopper (not shown) such as a screw is inserted. The other electronic unit 4 shown in FIGS. 2–4 is mounted on a receiving part 20P of the wiring board 20 shown in FIG. 6.

A pressure-welding terminal part 39 having a shape as illustrated, for example, in FIG. 8, of the busbar 30 is provided in a receiving part 29*a* of many holding parts 29. As shown in FIG. 7, an electric wire 9 is inserted and held in a guiding part 29*b* of the holding part 29.

Figure 8B:
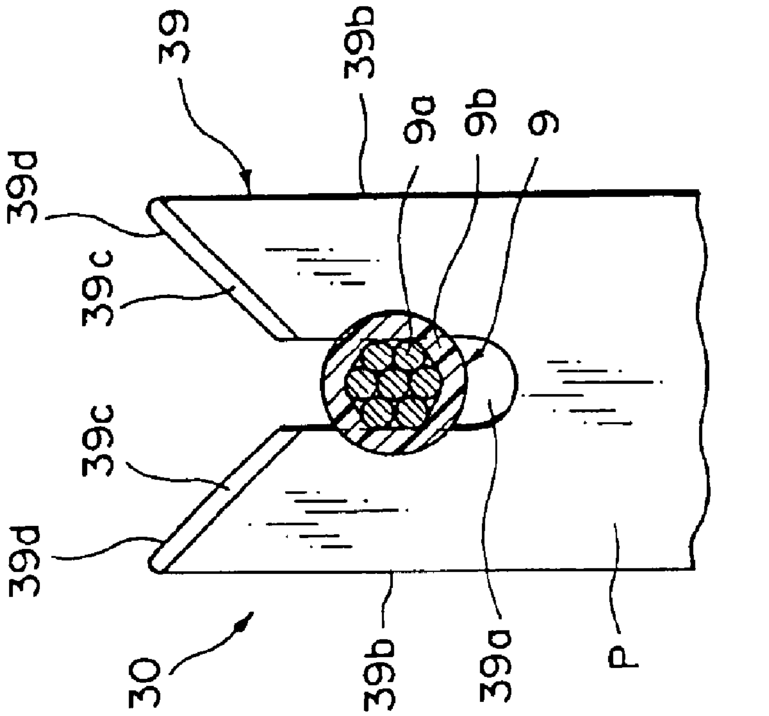
FIG. 8B is a view illustrating a state after a wiring is pressure-welding connected to a pressure-welding terminal part.
Figure 8A:
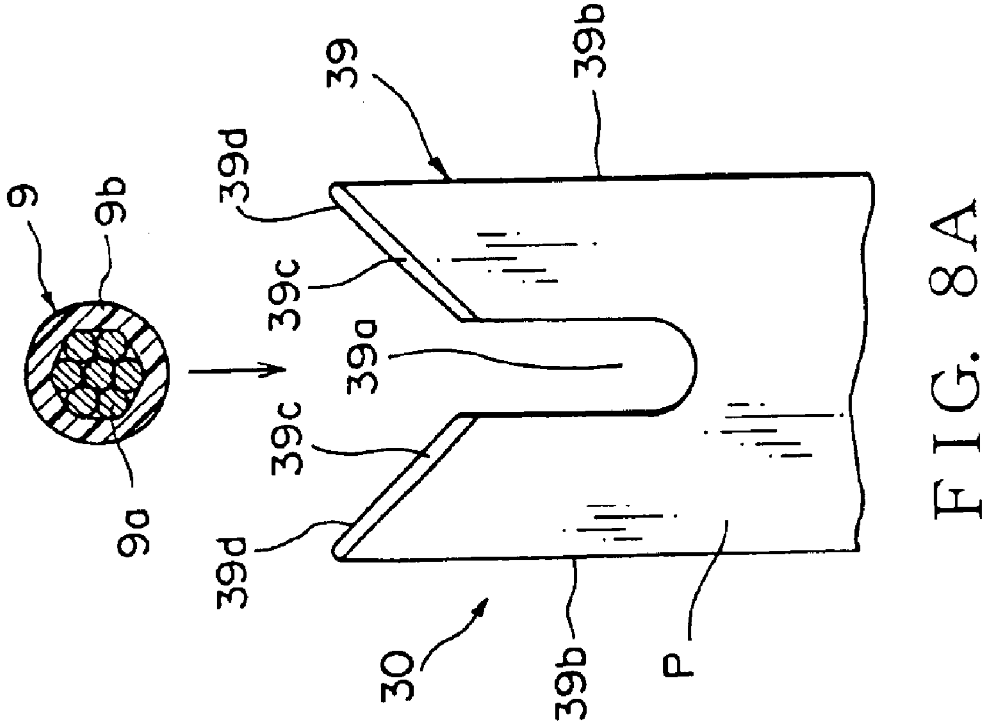
FIG. 8A is a view illustrating a state before a wiring is pressure-welding connected to a pressure-welding terminal part.

As shown in FIG. 8A, the pressure-welding terminal part 39 having a pressure-welding piece with a U-shaped pressure-welding slit 39*a* is formed between a pair of pressure-welding blades 39*b* arranged parallel to each other. The pair of the pressure-welding blades 39*b* having a plate shape is provided with the respective inclined parts 39*d* facing inward to each other. The inclined part 39*d* is provided with a blade part 39*c* which is comparatively sharp. That is, the thickness of the pressure-welding blade 39*b* is gradually made thinner.

As shown in FIG. 7, a wiring 9 is complicatedly arranged on the back side of the wiring board 20. As shown in FIG. 8A, a plurality of annealed thin copper wires are twisted so as to from the circuit conductor 9*a* and the circuit conductor 9*a* is coated with an insulating coating 9*b* made of polyvinyl chloride, thereby forming the wiring 9 having a round shape in cross section.

As shown in FIGS. 8A and 8B, the wiring 9 is pressed against a plurality of the pressure-welding terminal parts 39 so as to carry out a pressure welding, thereby the wiring 9 is electrically connected to the pressure-welding terminal part 39. When the wiring 9 is started to be pressure welded against the pair of the pressure-welding blades 39*b* of the pressure-welding terminal part 39, the insulating coating 9*b* of the wiring 9 is started to be cut by the sharp blade part 39*c* of the inclined part 39*d*.

When the wiring 9 is moved into the slit 39*a*, the insulating coating 9*b* of the wiring 9 is cut by the slit 39*a*, then as shown in FIG. 8B, the circuit conductor 9*a* comes in contact with the slit 39*a*, thereby the wiring 9 is electrically connected to the pressure-welding terminal part 39. Thus, the cutting of the insulating coating 9*b* of the wiring 9 and the connection between the circuit conductor 9*a* of the wiring 9 and the pressure-welding terminal part 39 are simultaneously carried out.

A wiring device (not shown in the figure) is used, the wiring 9 is pushed out from a wire-guiding part (not shown) of the wiring device, and the wiring board 20 is moved relatively to the wiring device in the front and rear direction or in the right and left direction, thereby the wiring 9 is arranged on the back side of the wiring board 20.

As shown in FIG. 7, the wire 9 is adequately bent along a side face 24*a* of a cylindrical projection 24 formed on the wiring board 20 so that an extending direction of the wire 9 to be arranged on the wiring board 20 can be changed. Each end 9*c* of the wire 9 is fit into a hollow groove-shaped wire-holding part 22*a* formed in a side plate 22 of the wiring board 20. The wire 9 is cut by an edged tool (not shown) such as a cutter and the wire 9 to be arranged on the wiring board 20 is provided with each end 9*c*.

A method of arranging the wiring on the wiring board 10 is similar to that of arranging the wiring on the wiring board 20 and each end 9*a* of the wire 9 is fit into a hollow groove-shaped wire-holding part 12*a* formed in a side plate 12 of the wiring board 10.

As shown in FIGS. 2 and 4, in order to facilitate the mounting of the power source module 6 on the upper wiring board 10, a base board 11 of the upper wiring board 10 is provided with a step part 11B, and another base board 11A according to a shape of a board 6A of the power source module 6, which is located at the lower side by one step, is formed from the base board 11. The upper base board 11 and the other base board 11A are integrally formed being connected by the step part 11B.

The other base board 11A is provided with a cylindrical aligning part 15B. As shown in FIG. 2, according to the part 15B, the board 6A of the power source module 6 is provided with a plurality of round hole-shaped aligning parts 6C.

Further, in order that the module 6 is positioned and mounted on the other base board 11A, as shown in FIG. 2, the other base board 11A is provided with a plurality of cylindrical positioning parts 11C and the board 6A of the module 6 is provided with a plurality of round hole-shaped positioning parts 6C according to the cylindrical positioning parts 11C.

The cylindrical aligning part 15B protrudes upper compared to the board 6A. In order that the housing member 50 is easily mounted on the module 6 and the upper wiring board 10, the cylindrical aligning part 15B passes through a round hole-shaped positioning part 6B of the board 6A and protrudes upward. As shown in FIGS. 2 and 3, according to a plurality of the cylindrical aligning parts 15B, the projecting piece 55 of the housing member 50 is provided with a plurality of round hole-shaped positioning parts 55*b*.

In order that the housing member 50 is positioned and mounted on the base board 11 of the upper wiring board 10, as shown in FIGS. 2 and 4, the base board 11 is provided with a plurality of cylindrical positioning parts 11*h*. The projecting piece 55 of the housing member 50 is provided with a plurality of round hole-shaped positioning parts 55*h* according to the cylindrical positioning parts 11*h*.

In order that the electronic unit 5 shown in FIG. 1 is securely mounted in the electric junction box 1, as shown in FIGS. 2 and 3, the upper side of the base board 11 is provided with a plurality of fixing parts 15A each having a fixing hole $15A_L$. Further, the upper side of the other base board 11A is provided with a plurality of cylindrical fixing parts 15B each having a fixing hole $15B_L$.

The cylindrical fixing part 15B acts as a positioning part for easily finding out the mounting position and direction of the power source module 6 and the housing member 50. As shown in FIG. 1, according to the fixing parts 15A and 15B, the board 5A of the electronic unit 5 is provided with a plurality of fixing parts 5V each having a round fixing hole $5V_L$.

Each electric contact part 36 formed protruding upward from the projecting piece 55 and the corresponding terminal (not shown in the figure) of the connector 5L of the electronic unit 5 are aligned, the fixing hole $15A_L$, fixing hole $15B_L$ and fixing hole $5V_L$ are aligned, a stopper (not shown) such as a screw is inserted from the fixing hole $5V_L$ to the fixing hole $15A_L$ or fixing hole $15B_L$ (see FIGS. 3 and 4), and a screwing part (not shown) of a screw engages with a fixing hole 25*a* of a fixing part 25 shown in FIGS. 6 and 7, thereby the electronic unit 5 is securely fixed to the wiring boards 10 and 20.

As shown in FIG. 2, the projecting piece 55 of the housing member 50 is provided with a plurality of the fixing parts 55*d*, the board 6A of the power source module 6 is provided with a plurality of the fixing parts 6D, the other board 11A is provided with a plurality of the other fixing parts (not shown) according to the fixing parts 55*d* and 6D, as shown in FIGS. 6 and 7, the board 21 of the power wiring board 20 is provided with a plurality of the other fixing parts 26, the lower side of the wiring board 20 is provided with the electronic unit 4, a board of another electronic unit 4 is provided with a fixing part (not shown), a long stopper (not shown) such as a screw is inserted into these fixing parts as described above, and a screwing part (not shown) of the screw is engaged with a fixing part (not shown) of a bottom wall 71 of the body 70 (see FIG. 1) of the electric junction box 1, thereby the housing member 50, the power source module 6, the upper wiring board 10, the lower wiring board 20 and the other electronic unit 4 together are securely fixed to the body 70 of the electric junction box 1.

Figure 5:
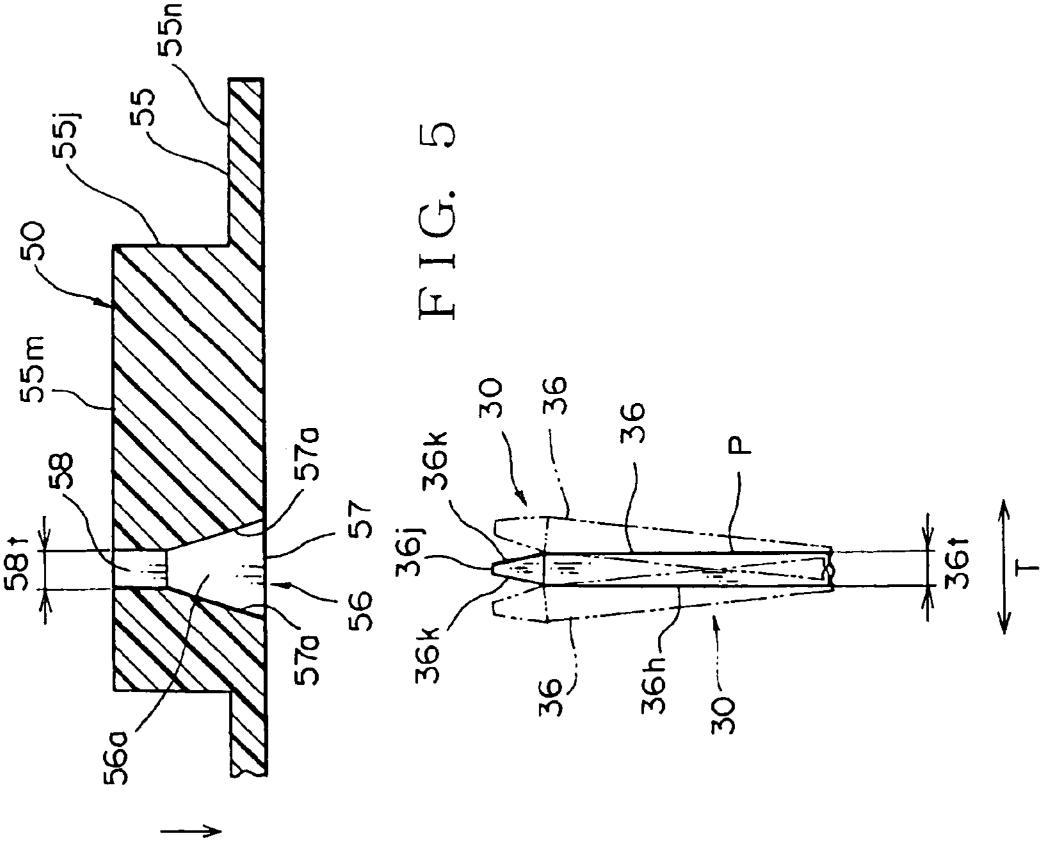
FIG. 5 is a view illustrating a state when an electric contact part of a busbar is being passed through a cavity part of a housing member.

As shown in FIGS. 1–4, a plurality of the electric contact parts 36 are aligned along a direction, which crosses at right angles the thickness direction T of the electric contact part 36 shown in FIG. 5 (see FIG. 4). As shown in FIG. 5, a tapered face 57*a*, for facilitating the simultaneous insertion of a plurality of the electric contact parts 36 into a plurality of the respective cavity parts 56 when one or all of the electric contact parts 36 are inclined in the thickness direction T of the electric contact part 36, is provided from an insertion opening 57 of the cavity part 56 toward the interior 56*a* of the cavity part 56.

Since such a tapered face 57*a* is formed at the cavity part 56, when the inclined electric contact part 36 is being inserted into the corresponding cavity part 56, the contact part 36 is guided by the tapered face 57*a*, thereby each contact part 36 is simultaneously inserted into the corresponding cavity part 56. Thereby, the contact part 36, which is inclined, and the position of which is shifted from a proper position thereof, is smoothly guided into the cavity part 56. Therefore, the electric junction box 1 (see FIG. 1) having good mounting workability can be provided.

In order to prevent the electric contact part 36 from being inclined or shifted from its proper position, as shown in FIG. 5, a thickness 36*t* of the straight part 36*h* of the contact part 36 is made approximately equal to a thickness 58*t* of an opening 58 at the upper side of the cavity part 56, which is provided at a thick part 55*m* of the projecting piece 55. The thickness 58*t* is a thickness along the thickness direction T of the contact part 36.

Figure 12:
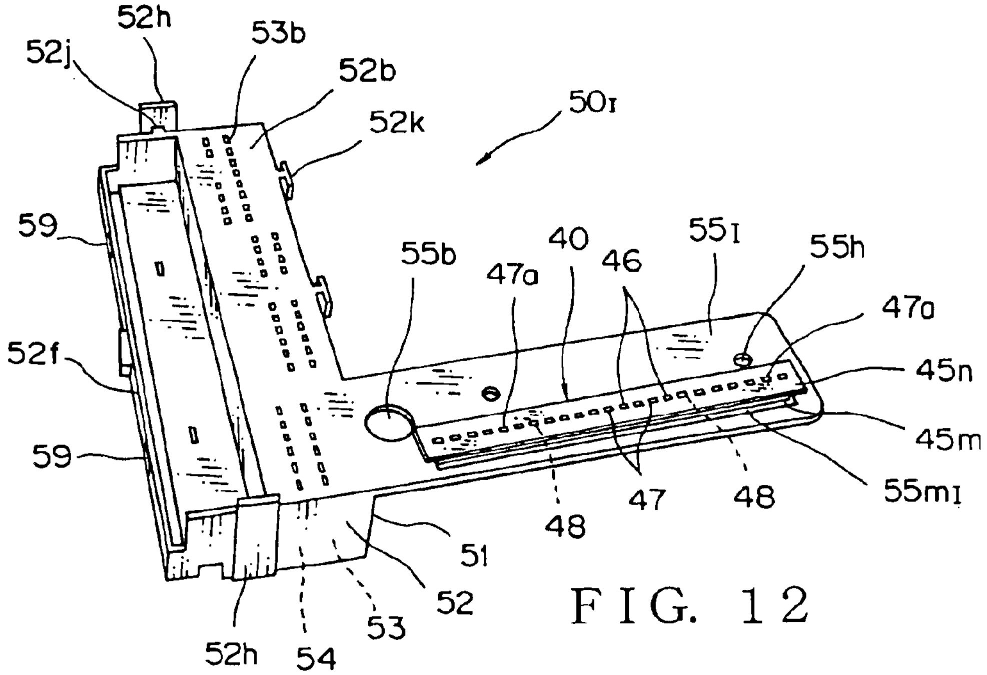
FIG. 12 is a perspective view illustrating another preferred embodiment of a housing member.

Instead of the housing member 50 made of synthetic resin shown in FIGS. 1–5, a housing member $50_1$ made of synthetic resin shown in FIG. 12 may be mounted to the electric junction box 1. That is, FIG. 12 shows another preferred embodiment of the housing member.

The housing member $50_1$ includes a housing body 51, a projecting piece $55_1$ formed from an end of the housing body 51, and a holding member 40 which is attached to the projecting piece $55_1$ and has a cavity part 46.

A base wall 52*b* of the housing body 51 is provided with a plurality of through holes 53*b* through which each terminal part of the corresponding busbar is inserted. The projecting piece $55_1$ shown in FIG. 12 extends from an end of the base wall 52*b* as a rectangular plate having a size smaller than that of the projecting piece 55 of the housing member 50 shown in FIGS. 1–5.

As shown in FIG. 12, the projecting piece $55_1$ is provided with a rectangular window-shaped opening $55m_1$, on which a holding member 40 made of synthetic resin is mounted.

The holding member 40 includes a thin part 45*n* having a long rectangular plate-shape and a thick part 45*m* having a rectangular parallelepiped-shape, which extends from the thin part 45*n*. The thin part 45*n* and thick part 45*m* are made of the same type of synthetic resin and formed integrally with each other.

Further, the thick part 45*m* is provided with a plurality of cavity parts 46 each having a rectangular hole-shape. The cavity part 46 penetrates from an insertion part 47 to an opening 48. An electric contact part of the busbar is inserted into the cavity part 46.

Similarly to the tapered face 57*a* shown in FIG. 5, the insertion part 47 shown in FIG. 12 is provided with a small tapered face 47*a*. Since the tapered face 47*a* is provided, a plurality of the electric contact parts of the respective busbar can be easily inserted into the respective cavity parts 46.

Since the holding member 40 made of synthetic resin is formed by injection molding method, the holding member 40 can be mass-produced accurately quickly.

As shown in FIG. 5, an inclined face 36*k* (see FIGS. 4, 5 and 7), for facilitating the simultaneous insertion of a plurality of the electric contact parts 36 into a plurality of the respective cavity parts 56 when one or all of the electric contact parts 36 are inclined in the thickness direction T of the electric contact part 36, is provided at an end 36*j* of the corresponding electric contact part 36.

Since such an inclined face 36*k* is formed at an end 36*j* of the electric contact part 36, when the inclined electric contact part 36 is being inserted into the corresponding cavity part 56, the contact part 36 is guided by the inclined face 36*k*, thereby each contact part 36 is simultaneously inserted into the corresponding cavity part 56. Thereby, the contact part 36, which is inclined, and the position of which is shifted from a proper position thereof, is smoothly inserted into the cavity part 56. Therefore, the electric junction box 1 (see FIG. 1) having good mounting workability can be provided.

As shown in FIGS. 2 and 3, the housing member 50 is provided with a guide part 52*h* at both sides thereof. According to the guide part 52*h*, as shown in FIG. 1, the body 70 of the electric junction box is provided with a guide-receiving part 76 at both side walls 72*a* and 72*c* thereof.

As shown in FIGS. 1 and 11, the guide-receiving part 76 has a T-shaped guide groove 76, according to which the guide part 52*h* has a plate-shaped guide piece 52*h* as shown in FIGS. 2 and 3. The guide part 52*h* is formed at the tip of a holding part 52*j* protruding toward the outside of a circumferential wall 52 of the housing member 50.

As shown in FIG. 1, the guide-receiving part 76 has a long and narrow groove corresponding to a frame part 76*b* protruding toward the outside of side walls 72*a*, 72*c* of the body 70 of the junction box and the holding part 52*j* (see FIGS. 2 and 3) of the housing member 70.

As shown in FIG. 1, the connector part 3 and the electronic unit 5 are adjacently placed on the upper layer part of the body 70 of the junction box. The connector part 3 and the electronic unit 5 are placed on the upper side of the wiring board 10, which is mounted in a receiving part 73 of the body 70 of the junction box.

The electronic unit 5 can be easily mounted on the body 70 of the electric junction box having such a mounting structure as described above. Therefore, the electric junction box 1 having good workability for mounting the electronic unit 5 can be provided. Further, a mating connector (not shown) of an external wiring harness (not shown) can be easily connected to the connector part 3 of the electric junction box 1 shown in FIG. 11.

As shown in FIGS. 1 and 11, the electric junction box 1 is provided with a fuse block 80 at the front thereof. Here, the fuse block means a block-shaped part in which a plurality of fuses are attached to a mating mount such as a housing, base and holder and formed integrally with the mating mount.

The fuse block 80 includes a front cover 90 made of synthetic resin for protecting each fuse (not shown). The front cover 90 includes: a cover body 91; a pair of hinge parts 92 which is provided at the upper side of the cover body 91 and is detachable to a fuse block body 81; and an operation part 93 which is provided at the lower side of the cover body 91 and facilitates the opening/closing action of the front cover 90 relatively to the fuse block body 81.

The pair of the hinge parts 92 provided on the upper side of the front cover 90 is mounted to a pair of hinge parts 82 provided at the front side of the fuse block body 81, thereby the front cover 90 is openably mounted on the fuse block body 81. Therefore, the maintenance such as the replacement of each fuse (not shown) mounted in the fuse block body 81 can be easily carried out.

Further, the fuse block body 81 is provided with a pair of locking parts 88, 89 having the corresponding locking projection 88, 89 at the front top and the front bottom of the body 81. Corresponding to the pair of the locking parts 88 provided at the front bottom of the fuse block body 81, a pair of engaging parts 78 having a rectangular engaging hole 78 is provided at the front bottom side of the body 50 of the junction box. Further, corresponding to the pair of the locking parts 89 provided at the front top of the fuse block body 81, a pair of engaging parts 59 having a rectangular engaging hole 59 is provided on a front wall 52*f* of the housing member 50.

The pair of the engaging parts 78 engages with the pair of the locking parts 88 so as to securely mount the fuse block body 81 on the body 70 of the electric junction box. The pair of the locking parts 89 engages with the pair of the engaging parts 59 so as to mount the housing member 50 on the body 70 of the electric junction box and the fuse block 80 mounted on the body 70.

Plural layers of tuning fork terminal part 38 shown in FIG. 6 is provided in the fuse block body 81 shown in FIGS. 1 and 11. The plural layers of the tuning fork terminal part 38 is formed by extending various busbars.

As shown in FIG. 1, the fuse block 80 including a plurality of blade-type fuses (not shown in the figure) therein is mounted on the front side of the body 70 of the electric junction box 1, so that tab terminals (not shown) of the blade-type fuses are electrically connected to the plural layers of the tuning fork terminal parts 38 shown in FIG. 6.

With the construction of the electric junction box 1 (see FIG. 1) as described above, a plurality of blade-type fuses can be easily quickly mounted in the junction box 1. Therefore, the mounting workability of the blade-type fuses into the junction box 1 can be improved.

Depending on a specification of the electric junction box, instead of the plural layers of the tuning fork terminal parts 38 shown in FIG. 6, for example, a tab-shaped terminal or a female terminal may be used.

As shown in FIGS. 1–8, the busbar 30 is tinned (P), so that when the terminal part 33, electric contact part 36, 37, tuning fork terminal parts 38 or pressure-welding terminal part 39 comes in contact with a mating terminal or mating electric contact part, the stability of the electric contact or electric connection can be improved. Further, a portion of the electric connection can be prevented from being oxidized.

If the plating is applied to one or both of the terminal parts or electric contact parts in order to improve the property of welding connection and contacting stability, corrosion resistance of the terminal part or electric contact part can be improved. Further, if a plated layer P such as the tinned layer P is applied to the whole length of the long busbar 30, the busbar 30 can be prevented from being corroded, thereby improving the durability of the busbar 30 for a long period of time.

Depending on a specification of the electric junction box, the plating such as the tinning described above may not be applied to the busbar 30.

Figure 9:
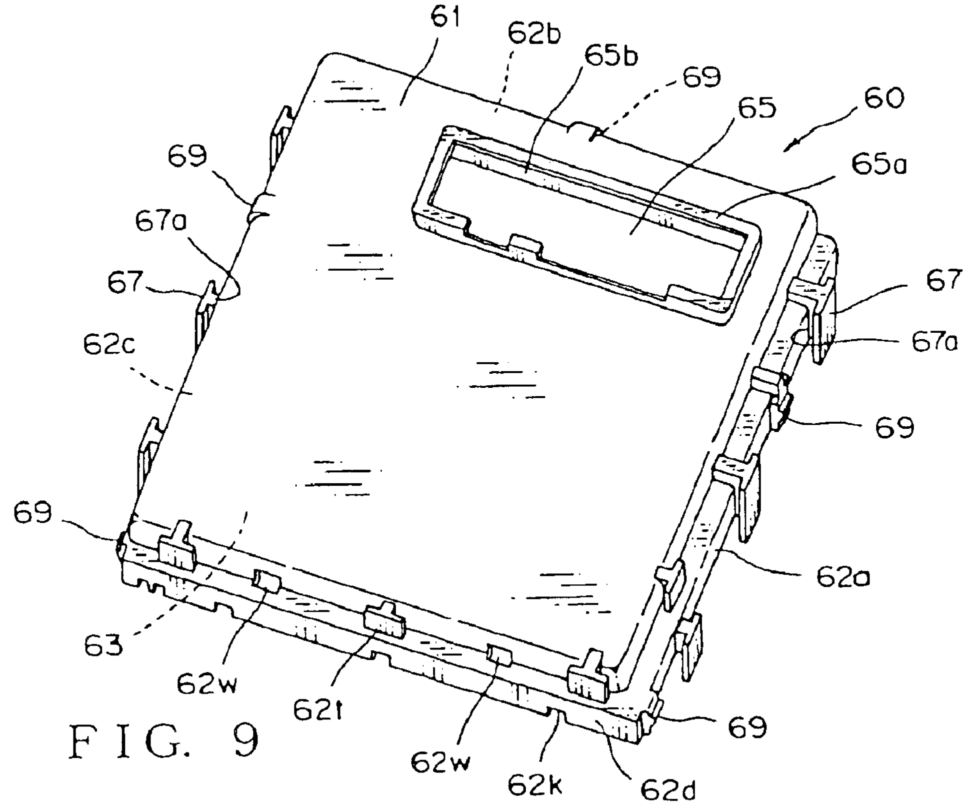
FIG. 9 is a perspective view illustrating an external of a cover.
Figure 10:
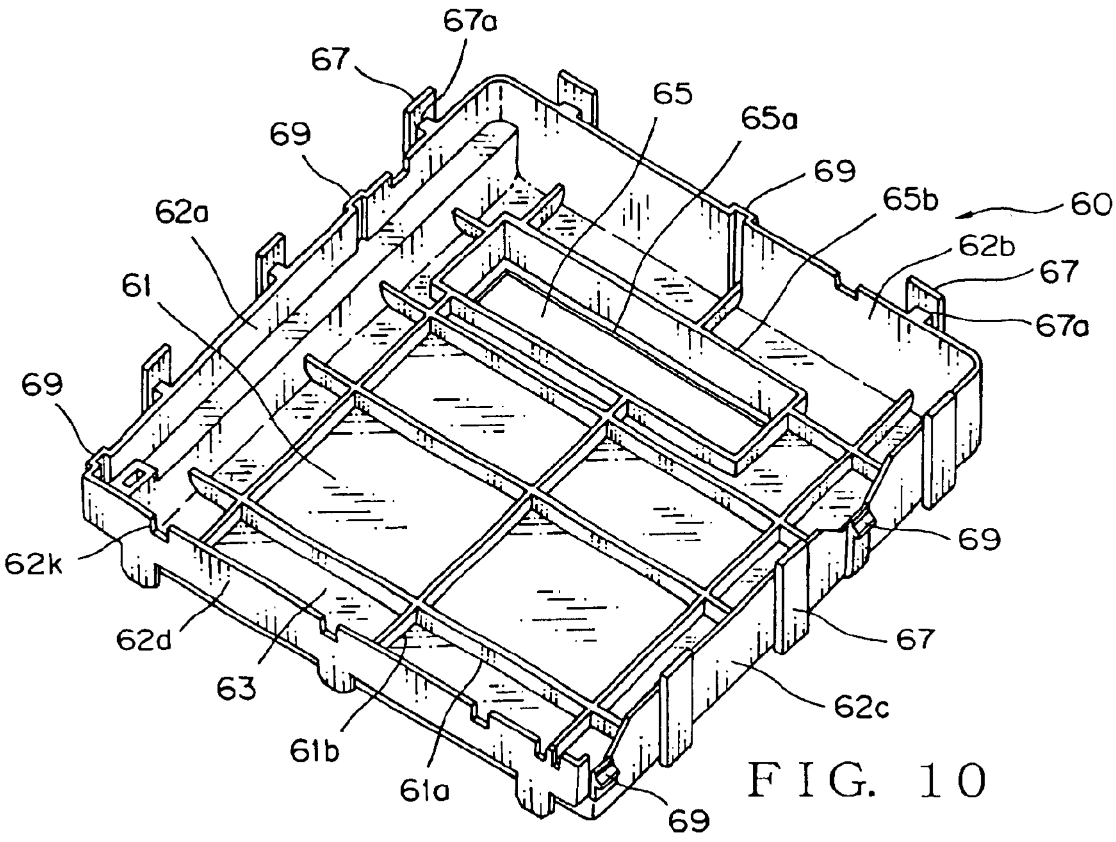
FIG. 10 is a perspective view illustrating an internal of a cover.

The upper cover 60 made of synthetic resin shown in FIGS. 9 and 10 is mounted on the body 70 of the electric junction box shown in FIG. 1, thereby assembling the electric junction box 1 as shown in FIG. 11.

As shown in FIGS. 9 and 10, the upper cover 60 includes a rectangular top wall 61, side walls 62*a*, 62*b*, 62*c* and 62*d* provided around the top wall 61, and a receiving part 63 inside. According to the other connector 5P of the electronic unit 5 shown in FIG. 1, the top wall 61 is provided with a rectangular opening 65.

As shown in FIGS. 9 and 10, a rib 65*a* is provided at the periphery of the opening 65. The rib 65*a* is followed by a guide rib 65*b* toward the inside of the upper cover 60. The rib 65*a* is formed according to an upper end part 5R of a connector housing 5Q which constitutes the other connector 5P shown in FIG. 1. The guide rib 65*b* is formed according to a side wall part 5S of the connector housing 5Q which constitutes the other connector 5P shown in FIG. 1.

As shown in FIG. 9, a side wall 62*d* of the upper cover 60 is provided with a plurality of T-shaped projecting parts 62*t* and a pair of windows 62*w*. Further, as shown in FIG. 10, in order to improve the strength of the upper cover 60, the inside of the top wall 61 is provided with other ribs 61*a*, 61*b*, which cross each other lengthwise and crosswise.

As shown in FIGS. 9 and 10, the side walls 62*a*, 62*b* and 62*c* are provided with a plurality of guide parts 67, according to which the side walls 72*a*, 72*b* and 72*c* of the body 70 of the junction box are provided with a plurality of guide-receiving parts 77. Further, the side walls 72*a* and 72*c* are provided with a plurality of frame-shaped projecting parts 72*h*.

As shown in FIG. 1, the guide-receiving part 77 is a T-shaped guide groove 77, according to which the guide part 67 is formed as a plate-shaped guide piece 67 as shown in FIGS. 9 and 10.

The guide piece 67 is provided at the tip of a holding part 67*a*, which protrudes from the side walls 62*a*, 62*b* and 62*c* toward the outside of the upper cover 60. As shown in FIG. 1, the guide-receiving part 77 includes a frame part 77*b* protruding outward compared to the side walls 72*a*, 72*b* and 72*c* and a thin long groove 77*a* according to the holding part 67*a* of the upper cover 60 shown in FIGS. 9 and 10.

As shown in FIGS. 9 and 10, the side walls 62*a*, 62*b*, 62*c* are provided with a locking part 69, i.e. a locking projection 69, according to which the side walls 72*a*, 72*b*, 72*c* shown in FIG. 1 are provided with an engaging part 79 having an engaging projection (not shown in the figure).

As shown in FIG. 1, after the electronic unit 5 is mounted in the body 70 of the electric junction box, then the cover 60 shown in FIG. 9 is put and mounted on the body 70, thereby assembling the electric junction box 1 as shown in FIG. 11.

At that time, locking parts 69 of the cover 60 shown in FIG. 9 are engaged with the respective engaging parts 79 of the body 70 shown in FIG. 1, thereby the cover 60 is securely mounted on the body 70 of the electric junction box without looseness. Further, simultaneously, a plurality of engaging parts 62*k* provided on the side wall 62*d* of the cover 60 shown in FIGS. 9 and 10 is engaged with a plurality of respective engaging parts 52*k* provided on the peripheral wall 52 of the housing member 50 shown in FIGS. 2 and 3.

Thereafter, a mating connector of an external wiring harness (not shown) is electrically connected to the connector part 3 of the electric junction box 1 shown in FIG. 11 and a mating connector of another external wiring harness (not shown) is electrically connected to the other connector part 5P of the electric junction box 1. The electric junction box 1 as described above is used as an electric junction box (J/B) which is connected to an electric wiring in, for example, a motor vehicle. Further, the electric junction box 1 may be used as, for example, a relay box (R/B).

FIGS. 13–23 show a preferred embodiment of a jig for correcting terminal alignment, an electric junction box capable of correcting terminal alignment, a method of correcting terminal alignment and a method of inserting terminals according to the present invention.

Figure 13:
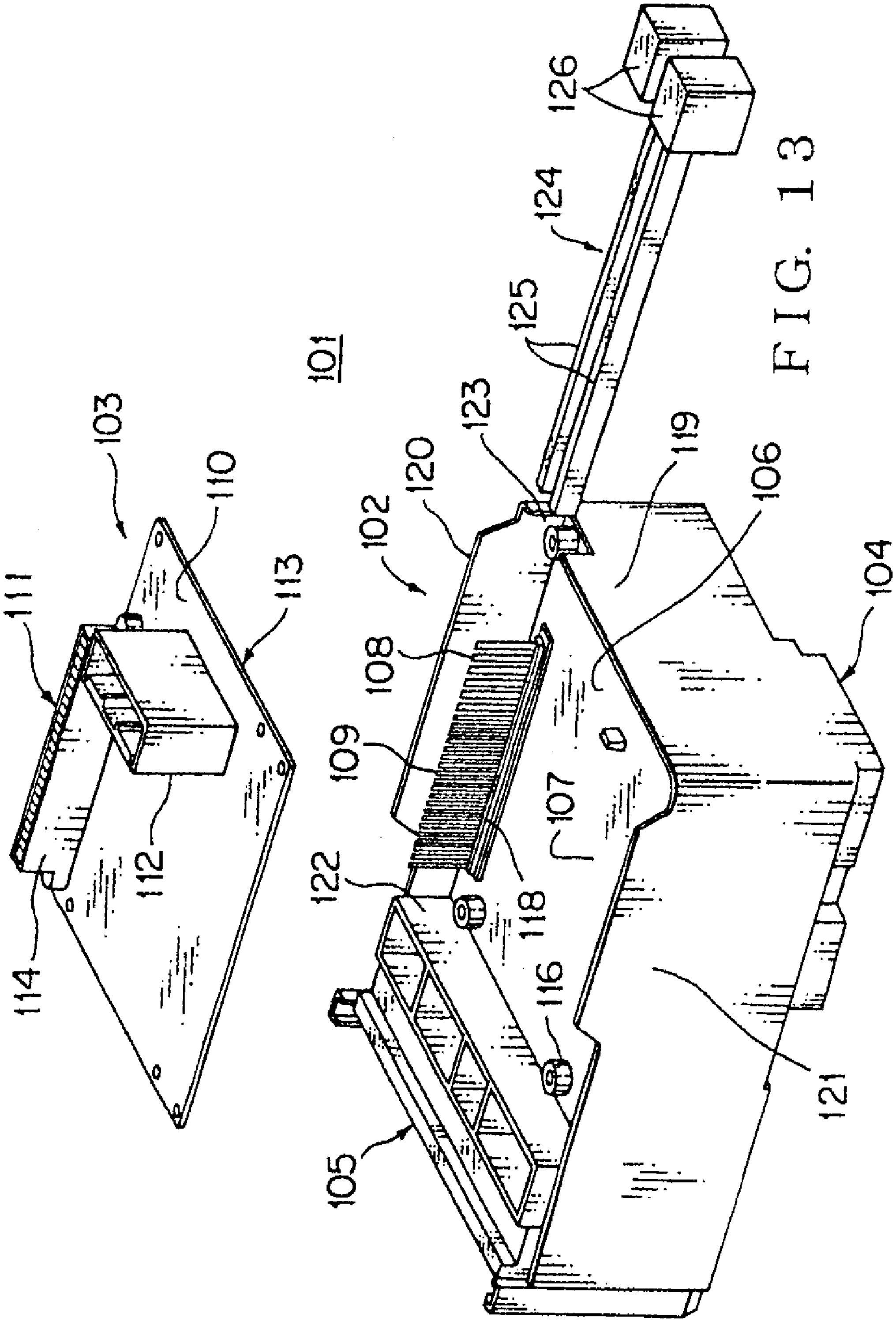
FIG. 13 is an exploded perspective view illustrating a preferred embodiment of a jig for correcting terminal alignment and an electric junction box capable of correcting terminal alignment, and a first step for a method of correcting terminal alignment and method of inserting terminals according to the present invention.

As shown in FIG. 13, an electric junction box 101 includes a body 102 of the electric junction box and a circuit body assembly 103 (mating unit) which is mounted on the body 102.

The body 102 includes a case 104 made of synthetic resin, a plurality of circuit boards (not shown in the figure) received in the case 104, a fuse mount 105 situated at one end of the case 104, and a plate-shaped middle cover 107 made of synthetic resin, which is a bottom wall of a receiving hollow 106 of the case 104.

Busbars or wires as an electric circuit are arranged on a circuit board (not shown) and a terminal for connecting a fuse following the busbar protrudes in the fuse mount 105, thereby the busbar can mount and connect a fuse (not shown) thereto from the side. A plurality of tab-shaped or pin-shaped male terminals following the busbar or wire penetrate through a wide insertion part of the middle cover 107, protruding in the receiving hollow 106 forming a line. Each male terminal 108, 109 is arranged with the same pitch per its type such as tab-shaped or pin-shaped one and protrudes long in the perpendicular direction at the same height.

The circuit body assembly 103 includes a horizontal insulating board 110 made of synthetic resin, a connector 111 rising up on a surface of the insulating board 110, a connector housing 112 made of insulating resin, a printed circuit formed on the insulating board with a main pattern, and a surface-mounted electronic component, and acts as an electronic control unit for use in a motor vehicle, for example. The insulating board 110 and a circuit constitute the circuit board 113.

A plurality of female terminals 115 (see FIG. 19) having a resilient piece are received forming a line in a housing 114 long from side to side made of insulating resin, thereby forming the connector 111. Each female terminal 115 is connected to a circuit on the circuit board 113 by soldering. The connector housing 112 receives a male terminal (not shown) of the body 102-side in its connector-coupling chamber, thereby constituting a connector for connecting an external wiring harness thereto.

The insulating board 110 is provided with a hole for inserting a male screw therethrough and the middle cover 107 is provided with a screw hole for fitting the male screw at a box part 116 for fixing a board. A plurality of holes 117 for inserting a male screw (see FIG. 19) forming a line at the lower side of the connector 111. According to the hole 117, the middle cover 107 is provided with a projection 118 for holding a male terminal, the projection 118 having a wide slit for inserting the male terminal therethrough.

The receiving hollow 106 of the case 104 is surrounded by four walls 119–122. The wall 119 located at the opposite side of the fuse mount 105 is provided with a rectangular notched hole 123 in the arranging direction of the male terminals 108, 109 and a terminal alignment correcting jig 124 can be inserted from the notched hole 123 into the receiving hollow 106. The notched hole 123 acts as a jig-inserting part. Thus, the electric junction box 101 includes the notched hole 123 for inserting the terminal alignment correcting jig 124 therethrough.

The protruding height of the male terminal 108, 109 is higher than the wall 119 at the notched hole 123-side and is approximately equal to the side wall 120, 121. After receiving the circuit board assembly 103, a cover (not shown) made of synthetic resin is mounted on the receiving hollow 106-side of the case 104.

The terminal alignment correcting jig 124 includes a pair of horizontal straight long sticks 125. A base of each stick 125 is fixed to a rectangular block 126, which is fixed to an opening/closing arm (not shown) of opening/closing motion drive means, for example, an air-type chuck cylinder (not shown).

The chuck cylinder is connected to, for example, a rod of a movable air-type horizontal drive cylinder (linear motion drive means) so as to be movable in the direction of the terminal arrangement. The horizontal drive cylinder may be set movable up and down together with the chuck cylinder by the linear motion drive means for the up-and-down direction such as a perpendicular drive cylinder, ball screw or motor. Instead of the horizontal drive cylinder, the linear motion drive means such as a ball screw or motor may be used. Further, the chuck cylinder may be a fixed-type and the body 102 of the junction box may be movably set on a rail. A drive mechanism of the terminal alignment correcting jig 124 will be explained later on.

The pair of the sticks 125, the opening/closing motion drive means, and the linear motion drive means in a direction of the terminal alignment and/or in a longitudinal direction (up-and-down direction) of the terminal constitute a terminal alignment correcting device (not shown in the figure). The circuit board assembly 103 is lifted up horizontally by using, for example, suction means or holding means so as to be automatically provided into the case 104.

Figure 15:
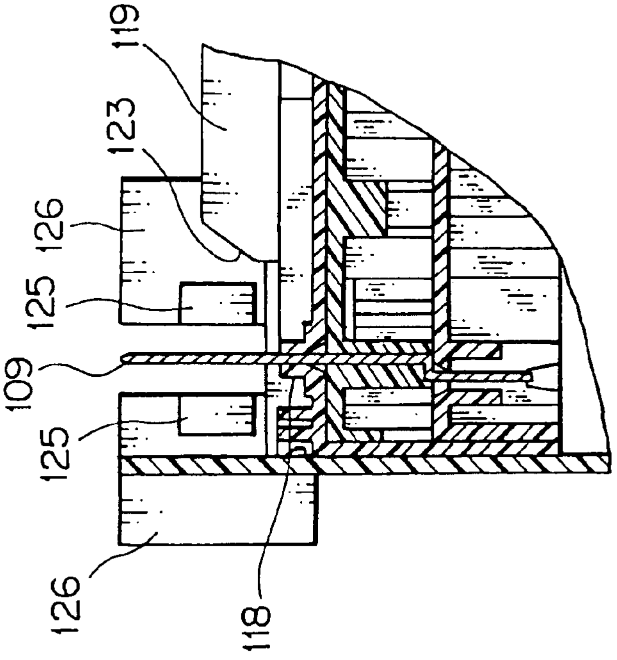
FIG. 15 is a front view illustrating the second step partially having a longitudinal cross section.
Figure 14:
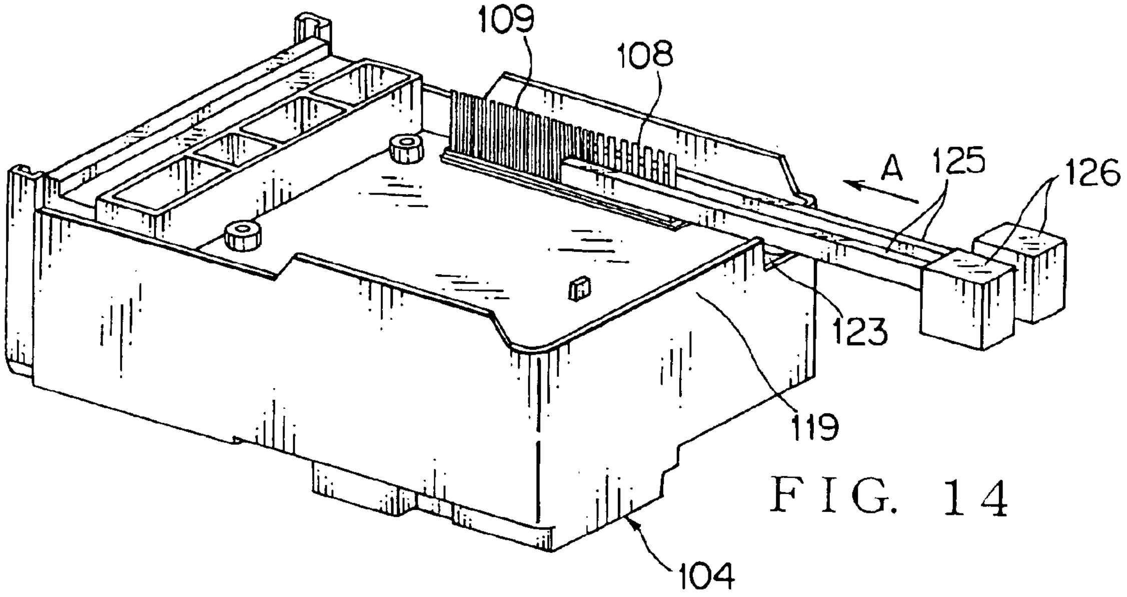
FIG. 14 is a perspective view illustrating a second step for a method of correcting terminal alignment and method of inserting terminals.

As shown in FIG. 13, first the pair of the sticks 125 is opened right and left being situated in front of the notched hole 123, then the horizontal drive cylinder is elongated so as to advance the pair of the sticks 125 from the notched hole 123 toward the inside of the case 104 along the alignment direction of the male terminals (i.e. in the direction of arrow A) as shown in FIG. 14. The pair of the sticks 125 is located at the respective sides of the line of the male terminals 108, 109 without coming contact into each other. As shown in FIG. 15, the pair of the sticks 125 is situated from the protruding base side of the male terminals 108, 109 up to the middle of the longitudinal direction of male terminals 108, 109. The end part of the male terminals 108, 109 is situated protrudingly above the pair of the sticks 125.

Figure 16:
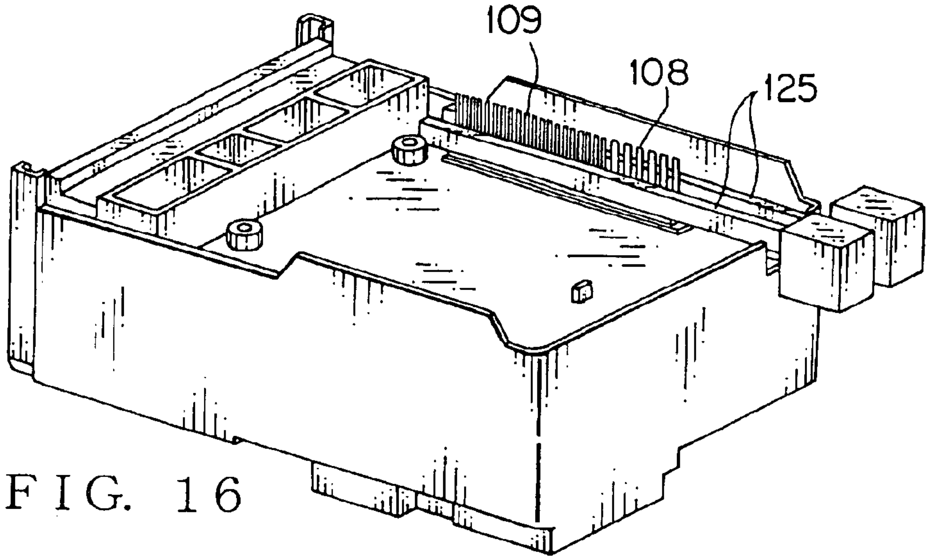
FIG. 16 is a perspective view illustrating a third step for a method of correcting terminal alignment and method of inserting terminals.
Figure 17:
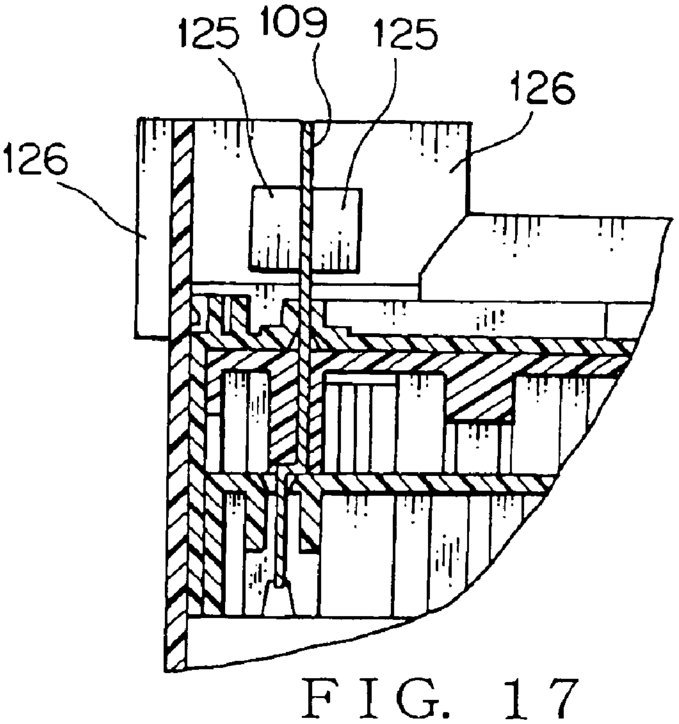
FIG. 17 is a front view illustrating the third step partially having a longitudinal cross section.

As shown in FIG. 16, when the pair of the sticks 125 covers all of the male terminals 108, 109, the chuck cylinder is closed so that the pair of the sticks 125 is closed and nips the respective male terminals 108, 109 from both sides. Thereby, the slant of each male terminal 108, 109 in the direction crossing the direction of the terminal alignment at right angles is corrected and all of the male terminals 108, 109 are situated perpendicularly. The state corresponding to FIG. 16 when the pair of the sticks 125 is closed is shown in FIG. 17. In FIGS. 14–17, the illustration of the circuit board assembly 103 is omitted.

Figure 18:
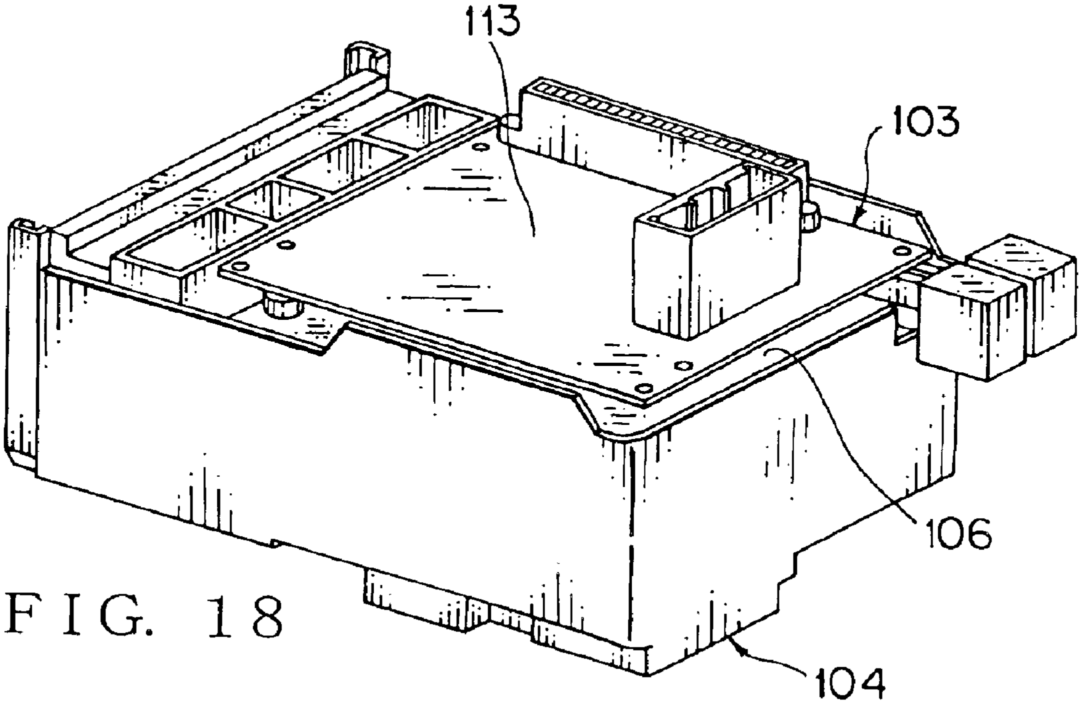
FIG. 18 is a perspective view illustrating a fourth step for a method of correcting terminal alignment and method of inserting terminals.
Figure 19:
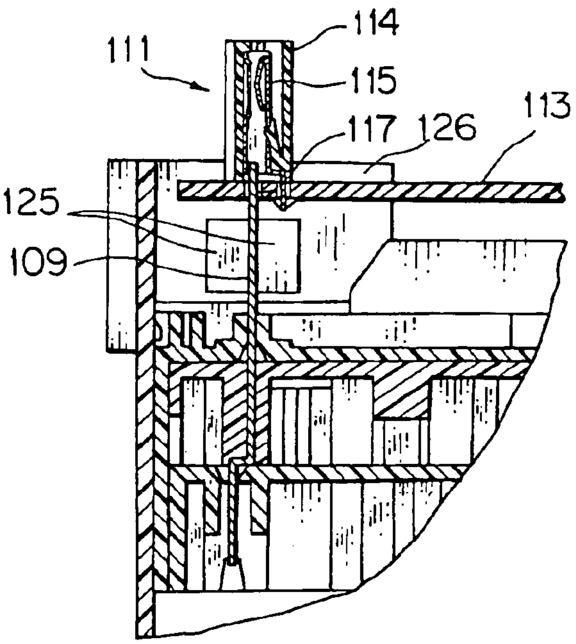
FIG. 19 is a front view illustrating the fourth step partially having a longitudinal cross section.

When the pair of the sticks 125 nips the male terminals 108, 109, as shown in FIGS. 18 and 19, the circuit board assembly 103 is mounted on the receiving hollow 106 of the case 104. Since each terminal 108, 109 is aligned in a line without a slant by the pair of the sticks 125, the terminals 108, 109 can be smoothly inserted into the corresponding holes of the circuit board 113 without interference.

Figure 20:
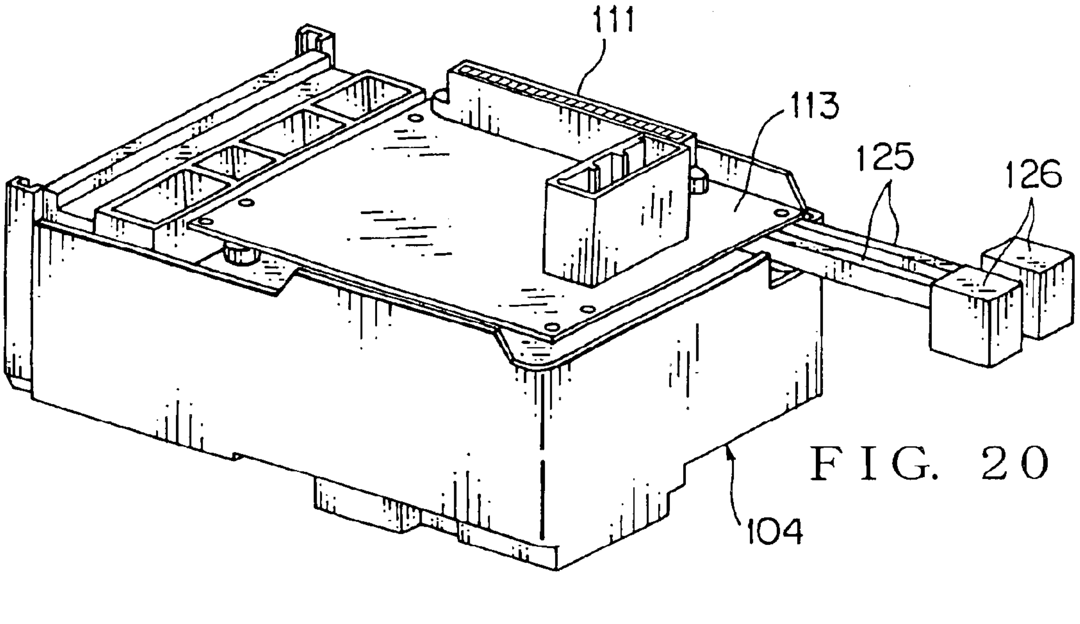
FIG. 20 is a perspective view illustrating a fifth step for a method of correcting terminal alignment and method of inserting terminals.
Figure 21:
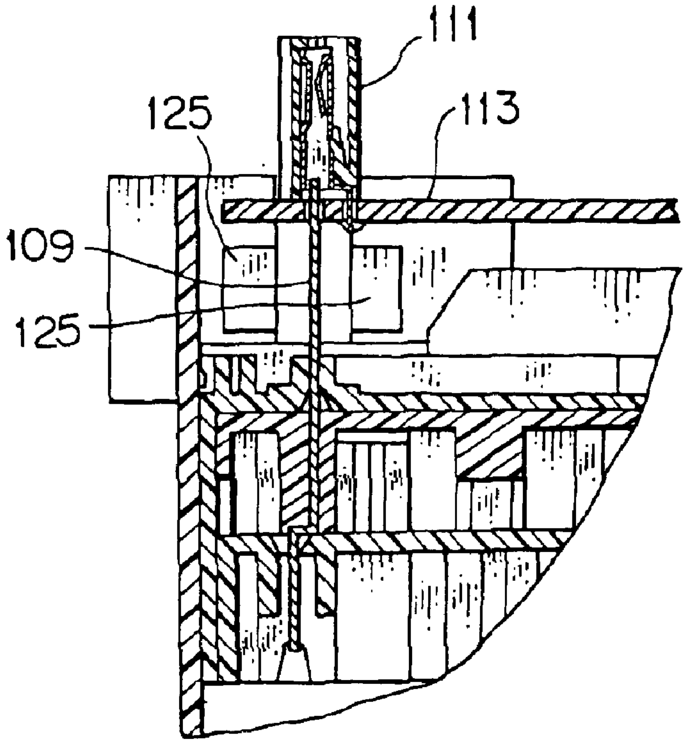
FIG. 21 is a front view illustrating the fifth step partially having a longitudinal cross section.

When the terminals 108, 109 are inserted into the corresponding holes 117 of the circuit board 113, the chuck cylinder is opened so that the pair of the sticks 125 is opened as shown in FIGS. 20 and 21, then the horizontal drive cylinder is compressed so as to move the pair of the sticks 125 back keeping the pair opened.

Figure 23:
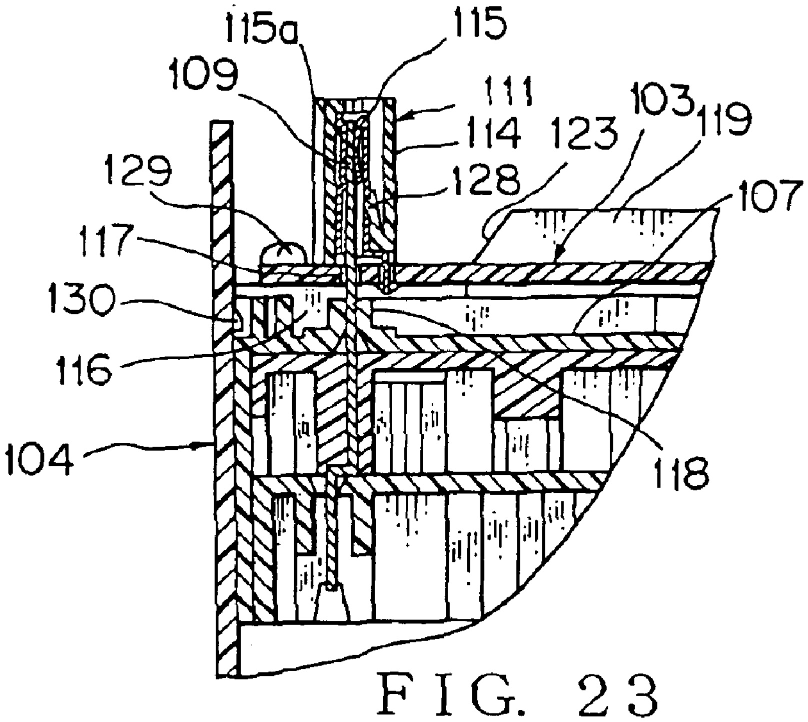
FIG. 23 is a front view illustrating the sixth step partially having a longitudinal cross section.
Figure 22:
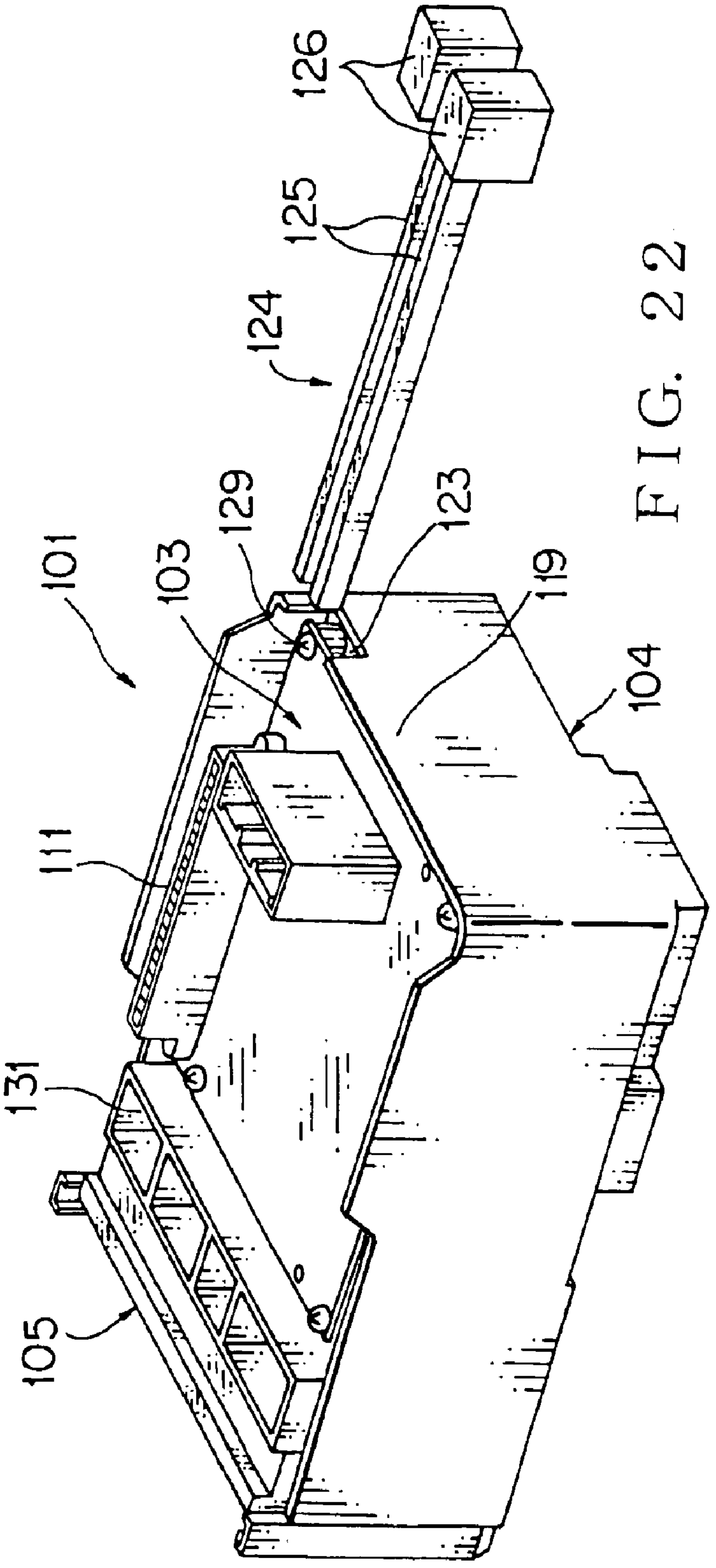
FIG. 22 is a perspective view illustrating a sixth step for a method of correcting terminal alignment and method of inserting terminals.

As shown in FIGS. 22 and 23, when the pair of the sticks 125 is pulled out from the notched hole 123 of the case 104 toward the outside, the circuit board assembly 103 is pushed downward, so that the male terminals 108, 109 are accurately inserted into the connector 111 without positional deviation and securely come in contact with corresponding female terminals 115 situated in the connector with accurate contacting pressure. The female terminal 115 (see FIG. 23) is locked in the terminal receiving chamber of a housing 114 made of insulating resin by a flexible locking lance 128. The circuit board assembly 103 is fixed to a boss 116 of a middle cover 107 by a machine screw 129. The periphery of the middle cover 107 is locked by a locking projection 130 in the case 104. A cover (not shown in the figure) is mounted on the case 104 from the upper side of the circuit board assembly 103, thereby constructing the electric junction box 101. It may be possible to close the notched hole 123 with a part of the cover.

The male terminals 108, 109 are connected to the circuit board assembly 103 through the female terminals 115 and to a power source or an external wiring harness (not shown) at the load-side from a connector 131 through a electric circuit such as a busbar in the case 104 or a fuse situated on the fuse mount 105.

In FIG. 22, the constructed electric junction box 101 is taken out from an assembling machine, then another body 102 (see FIG. 13) of the electric junction box is set in the assembling machine so that the alignment correction of the male terminals 108, 109 is carried out with the steps illustrated in FIGS. 13–22.

In the preferred embodiment described above, the pair of the sticks 125 is entered into the case 104 from the side in a horizontal direction. However, instead, the pair of the sticks 125 may be entered into the case 104 from the upper side of the case 104 along the longitudinal direction of each male terminal 108, 109 from the end of the terminal toward the base end of the terminal. In this case, the case 104 has a similar notched hole 123. If the wall 119 around the receiving hollow part 106 of the case 104 is situated high, a rectangular hole may be penetratingly formed instead of the notched hole 123. In such a case, the entering motion of the pair of the sticks 125 into the case 104 is limited to a horizontal direction. The shape of the notched hole 123 or the hole described above is not necessarily limited to a rectangular shape and may be a long hole-shape if the cross section of the stick 125 is a half-circle.

Besides an electric junction box, the terminal alignment correcting jig 124 and the method of correcting terminal alignment described above can be applied in a case, for example, a case in which female terminals of a mating connector (mating unit) are connected to male terminals 108, 109 on an electric circuit board or a case in which male terminals 108, 109 are inserted into a connector housing (mating unit) so as to construct a connector.

The pair of the sticks 125 may be provided with a tapered guide face (not shown in the figure) inside the end thereof so that the pair of the sticks 125 can enter smoothly in the horizontal direction relatively to the male terminals 108, 109, or alternatively, the pair of the sticks 125 may be provided with a tapered guide face (not shown in the figure) inside the bottom end thereof so that the pair of the sticks 125 can enter smoothly in the perpendicular direction relatively to the male terminals 108, 109. In these cases, in comparison with a case of no tapered guide face provided, the opening distance between the pair of the sticks 125 can be set short, so that the notched hole 123 can be made compact and the correction of the terminal alignment can be carried out quickly.

In the preferred embodiment described above, the correction of alignment of the terminals 108, 109 upon assembling the electric junction box is explained. However, instead, the terminal alignment correcting jig 124 and the method of correcting terminal alignment described above can be used when an external unit (mating unit) or external connector (mating unit) is being connected to each male terminal in an electric junction box after assembling the junction box. Further, if a hole of a slit of the male terminal insertion part 118 of the middle cover 107 shown in FIG. 23 is narrow, by using the terminal alignment correcting jig described above, the mounting of the middle cover 107 can be smoothly carried out without interference with the male terminals 108, 109.

In the preferred embodiment described above, the correction of alignment of a plurality of the male terminals 108, 109 is explained. However, instead, if the opening distance of the pair of the sticks 125 is set longer than that described above, the alignment correction of a plurality of female terminals (not shown) can be carried out. If the pair of the sticks 125 may simultaneously hold perpendicular boards of male and female terminals, an alignment line of the male terminals and that of the female terminals can be simultaneously corrected.

Further, even if the terminals 108, 109 are aligned in tow lines having a step therebetween, the pair of the sticks 125 can be bent in a crank shape, for example, so that the alignment correction of the two lines can be simultaneously carried out. If one of the pair of the sticks 125 is provided with a plurality of correction projections which enter into a gap between the terminals 108 and 109 in the alignment direction with the same pitch as the terminals, the slant of the terminals 108, 109 in the alignment direction can be corrected as well.

Each terminal 108, 109 may be situated not perpendicularly but horizontally and the pair of the sticks 125 may be placed not a right-and-left direction but an up-and-down direction, so that the correction of the terminal alignment can be carried out. Alternatively, each male terminal 108, 109 may be raised down perpendicularly toward the lower side of the body 102 of the junction box, the pair of the sticks 125 may be placed in the same manner as described above, and the circuit board assembly 103 may be mounted to the case 104 from the lower side of each male terminal, so that the correction of the terminal alignment can be carried out.

In the preferred embodiment described above, the pair of the sticks 125 nips each male terminal 108, 109. However, if the size of the male terminal insertion hole 117 of the circuit board 113 or the allowance of bending of a resilient contact part 115*a* of the female terminal 115 in the connector 111 is large, the pair of the sticks 125 does not necessarily nip each male terminal 108, 109, instead, only slanted male terminals may be corrected approximately perpendicularly with one of the sticks 125 so as to meet the maximum allowance value of slant of the male terminal 108, 109 for insertion into the male terminal insertion hole 117 or the female terminal 115, while the opening distance (opening amount) of the pair of the sticks 125 may be adjusted by a stopper of the chuck cylinder so that non-slanted male terminals are kept from the pair of the sticks 125 or weakly come in contact with the sticks 125. Since the slant direction varies depending on each male terminal 108, 109, the pair of the sticks 125 is necessary. The opening amount of the pair of the sticks 125 is set adjustable, thereby meeting the needs of the terminals 108, 109 having various dimensions (plate thickness or length).

If the pair of the sticks 125 is set non-openable, a tapered guide face (not shown) may be formed at the inside of the end or lower end of the pair of the sticks 125 in FIG. 13, so that each male terminal 108, 109 can be smoothly inserted into the pair of the sticks 125. Of course, the pair of the sticks 125 is made openable and nips each male terminal 108, 109, thereby improving the accuracy of the correction of the alignment of the male terminals 108, 109.

Figure 24:
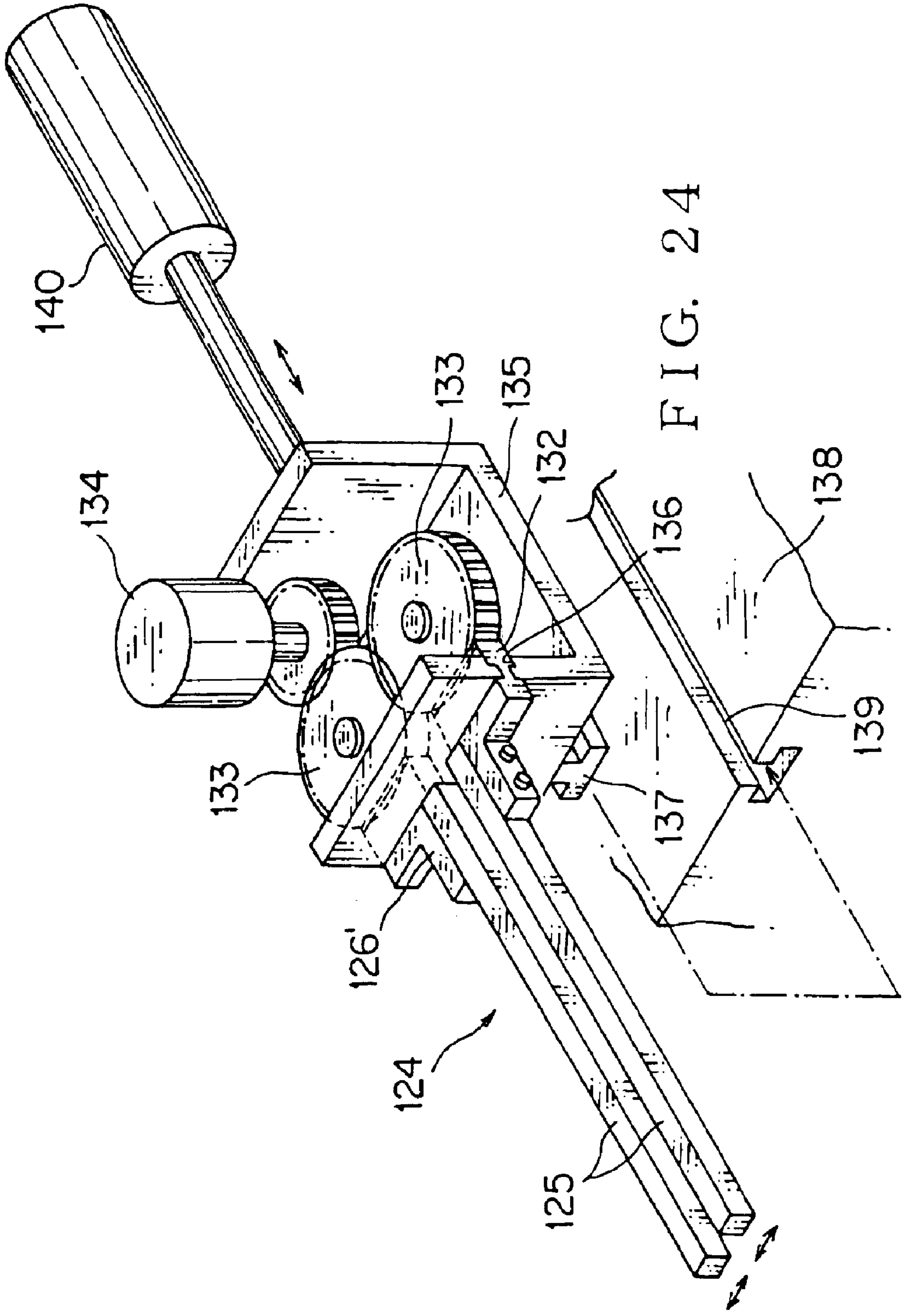
FIG. 24 is an exploded perspective view illustrating a preferred embodiment of drive means of the jig for correcting terminal alignment.
Figure 26:
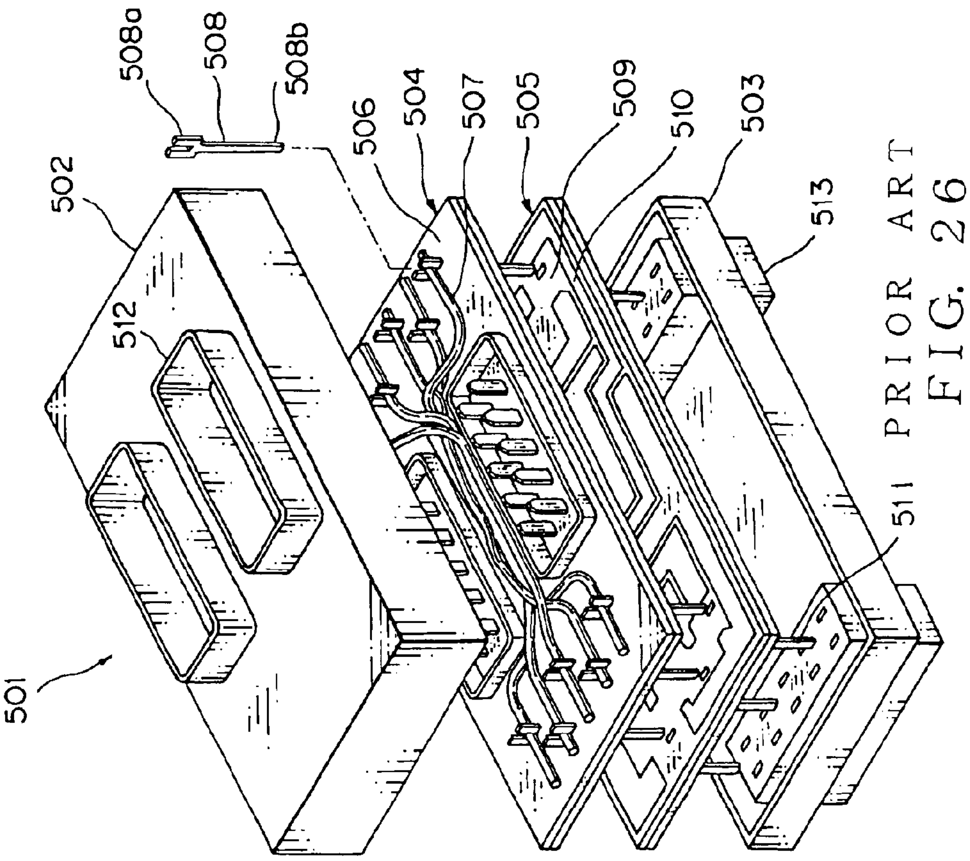
PRIOR ART FIG. 26
FIG. 26 is an exploded perspective view illustrating an example of a conventional electric junction box.
Figure 25:
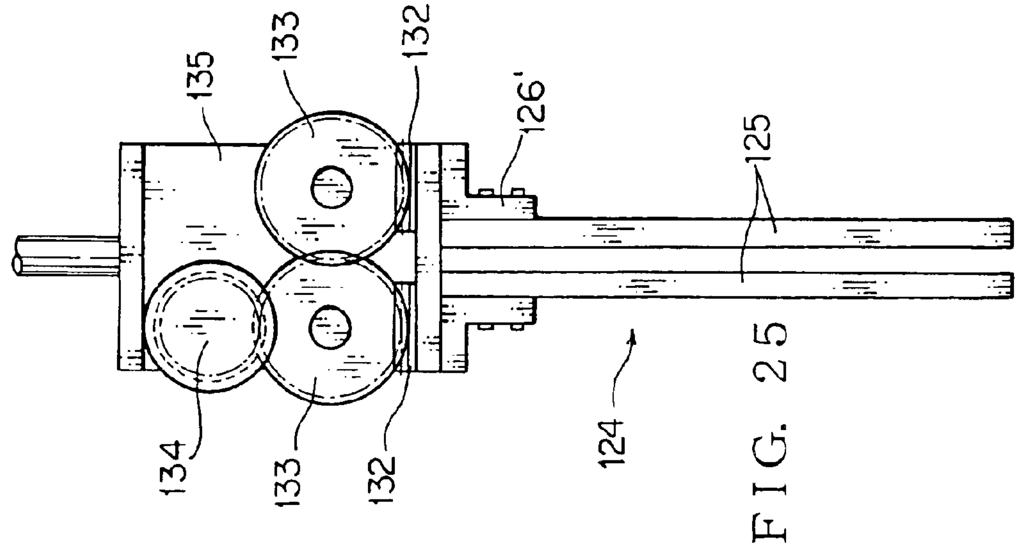
FIG. 25 is plan view illustrating a primary part of the drive means of the jig for correcting terminal alignment.

FIGS. 24 and 25 show a preferred embodiment of a drive mechanism (drive means) of the terminal alignment correcting jig 124.

The base end of the pair of the sticks 125 is fixed to a block 126, each pinion gear 133 engages with the corresponding rack 132, both gears 133 engages with each other, a gear of a rotating motor 134 is linked to one gear 133, and both gears rotates inversely by the rotation of the motor 134 so as to open the pair of the stocks 125.

Each rack 132 slidably engages with a horizontal groove 136 of a front wall of a frame 135, a slider 137 is fixed to a bottom of the frame 135, the slider 137 slidably engages with a guide groove 139 extending back-and-forth of a pedestal 138, and the frame 135 is moved on the pedestal 138 by a horizontal cylinder 140.

The drive mechanism shown in FIGS. 24 and 25 is only an example. Instead of this, the rack may be provided in front and rear of the gear of the motor 134, or alternatively, a driven wheel (not shown) at the base end side of the pair of the sticks 125 may be slidably engaged along one or two cams (not shown). A cylinder 140 for moving linearly may be two-step type so as to obtain a long stroke.

The aforementioned preferred embodiments are described to aid in understanding the present invention and variations may be made by one skilled in the art without departing from the spirit and scope of the present invention.

What is claimed is:

1. A mounting structure of an electric junction box, in which an external wiring harness is connected to an internal electronic unit through a busbar, comprising:

a terminal part of the busbar;

a housing member for receiving the terminal part;

a projecting piece comprising an L-shaped plate having a thin part, a step part and a thick part, projecting from a circumferential wall of the housing member; and a cavity part of the projecting piece, into which an electric contact part of the busbar is inserted;

wherein the terminal part is combined with the housing member so as to form a connector part, which is connected to a mating connector of the external wiring harness, and the electric contact part is inserted into the cavity part so as to correct the inclined electric contact part, thereby connecting the corrected electric contact part to the electronic unit.

2. The mounting structure of an electric junction box according to claim 1, wherein a plurality of the electric contact parts are substantially aligned with each other, and when each electric contact part is inclined in a thickness direction thereof, tapered faces for facilitating insertion of a plurality of the electric contact parts into a plurality of the cavity parts are formed at insertion parts of a plurality of the cavity parts.

3. The mounting structure of an electric junction box according to claim 1, wherein a plurality of the electric contact parts are substantially aligned with each other, and when each electric contact part is inclined in a thickness direction thereof, inclined faces for facilitating insertion of a plurality of the electric contact parts into a plurality of the cavity parts are formed at ends of a plurality of the electric contact parts.

4. A mounting structure of an electric junction box in which an external wiring harness is connected to an internal electronic unit through a busbar, comprising:

a terminal part of the busbar;

a housing member for receiving the terminal part;

a projecting piece projecting from the housing member; and a cavity part of the projecting piece, into which an electric contact part of the busbar is inserted;

wherein the terminal part is combined with the housing member so as to form a connector part, which is connected to a mating connector of the external wiring harness, and the electric contact part is inserted into the cavity part so as to correct an inclined electric contact part, thereby connecting a corrected electric contact part to the electronic unit; and wherein the connector part and the electronic unit are adjacently arranged on an upper part of an electric junction box body in which the connector part and the electronic unit are provided.

5. A mounting structure of an electric junction box in which an external wiring harness is connected to an internal electronic unit through a busbar, comprising:

a terminal part of the busbar;

a housing member for receiving the terminal part;

a projecting piece projecting from the housing member; and a cavity part of the projecting piece, into which an electric contact part of the busbar is inserted;

wherein the terminal part is combined with the housing member so as to form a connector part, which is connected to a mating connector of the external wiring harness, and the electric contact part is inserted into the cavity part so as to correct an inclined electric contact part, thereby connecting a corrected electric contact part to the electronic unit; and wherein the busbar is mounted on a wiring board on which the housing member and the electronic unit are mounted.

* * * * *